(12) United States Patent
Kim et al.

(10) Patent No.: US 12,388,046 B2
(45) Date of Patent: Aug. 12, 2025

(54) SEMICONDUCTOR PACKAGE

(71) Applicant: SAMSUNG ELECTRONICS CO., LTD., Suwon-si (KR)

(72) Inventors: Hongwon Kim, Suwon-si (KR); Junmo Koo, Hwaseong-si (KR); Yeonjoo Kim, Seoul (KR); Yunhee Kim, Hwaseong-si (KR); Jongkook Kim, Suwon-si (KR); Doohwan Lee, Cheonan-si (KR); Jeongho Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 13 days.

(21) Appl. No.: 17/154,789

(22) Filed: Jan. 21, 2021

(65) Prior Publication Data
US 2021/0407962 A1 Dec. 30, 2021

(30) Foreign Application Priority Data

Jun. 30, 2020 (KR) .................. 10-2020-0079871

(51) Int. Cl.
H01L 25/065 (2023.01)
H01L 23/00 (2006.01)
(Continued)

(52) U.S. Cl.
CPC ...... H01L 25/0655 (2013.01); H01L 23/3157 (2013.01); H01L 23/49816 (2013.01);
(Continued)

(58) Field of Classification Search
CPC ............ H01L 23/5383; H01L 23/5384; H01L 23/5385; H01L 23/49822; H01L 23/49816;
(Continued)

(56) References Cited

U.S. PATENT DOCUMENTS 8,901,748 B2 12/2014 Manusharow et al.
9,807,884 B2 10/2017 Hwang et al.
(Continued)

FOREIGN PATENT DOCUMENTS

JP 6455998 B2 1/2019
KR 10-2020-0059533 A 5/2020
(Continued)

OTHER PUBLICATIONS

Communication issued Dec. 18, 2024 by the Korean Intellectual Property Office in counterpart Korean Patent Application No. 10-2020-0079871.

*Primary Examiner* — Victor A Mandala
*Assistant Examiner* — Lawrence C Tynes, Jr.
(74) *Attorney, Agent, or Firm* — Sughrue Mion, PLLC

(57) ABSTRACT

A semiconductor package includes a base substrate, an interposer package disposed on the base substrate, and first and second semiconductor chips disposed on the interposer package, the interposer package includes a first redistribution layer, a bridge chip including a bridge circuit, and a vertical connection structure including a plurality of wiring layers, and wherein each of the first semiconductor chip and the second semiconductor chip is electrically connected to the bridge circuit and the plurality of wiring layers through the first redistribution layer.

15 Claims, 15 Drawing Sheets

(51) Int. Cl.
   *H01L 23/31*    (2006.01)
   *H01L 23/498*   (2006.01)
   *H01L 23/538*   (2006.01)

(52) U.S. Cl.
   CPC ...... *H01L 23/5381* (2013.01); *H01L 23/5383* (2013.01); *H01L 23/5384* (2013.01); *H01L 23/5385* (2013.01); *H01L 24/16* (2013.01); *H01L 2224/16227* (2013.01)

(58) Field of Classification Search
   CPC ... H01L 23/3128; H01L 23/5381–5386; H01L 23/49827; H01L 2224/023–024; H01L 2224/02372; H01L 2224/19–225; H01L 2224/96; H01L 2224/2101; H01L 2224/73209; H01L 2224/73217; H01L 2224/73223; H01L 2224/73231; H01L 2224/241–24265; H01L 2224/22505; H01L 2224/224; H01L 2224/221; H01L 2224/2205; H01L 2224/13008; H01L 2224/02333; H01L 2224/16227; H01L 2224/02373; H01L 2224/02331; H01L 24/19–20; H01L 24/96; H01L 24/16; H01L 24/02; H01L 24/13; H01L 25/0652; H01L 25/071; H01L 25/112; H01L 25/042; H01L 25/0655; H01L 25/072; H01L 25/0753; H01L 25/115; H01L 25/10–13; H01L 25/03–0756; H01L 2225/03–06596; H01L 2225/10–1094; H01L 2924/15153; H01L 2924/15192
   See application file for complete search history.

(56) References Cited

U.S. PATENT DOCUMENTS

| | | | |
|---|---|---|---|
| 10,163,798 | B1 | 12/2018 | Alur et al. |
| 10,224,272 | B2 | 3/2019 | Kim et al. |
| 11,302,643 | B2* | 4/2022 | Ganesan ................ H01L 23/367 |
| 2014/0131854 | A1* | 5/2014 | Hawk ...................... H01L 24/06 |
| | | | 257/737 |
| 2017/0330835 | A1* | 11/2017 | Deshpande ............. H01L 25/50 |
| 2018/0040548 | A1 | 2/2018 | Kim et al. |
| 2019/0295951 | A1* | 9/2019 | Darmawikarta .... H01L 23/5381 |
| 2019/0319626 | A1* | 10/2019 | Dabral ................. H01L 23/5381 |
| 2019/0341351 | A1 | 11/2019 | May et al. |
| 2020/0006232 | A1 | 1/2020 | Pietambaram et al. |
| 2020/0083179 | A1* | 3/2020 | Lee ...................... H01L 23/5384 |
| 2020/0161266 | A1 | 5/2020 | Shim et al. |
| 2020/0243450 | A1* | 7/2020 | Cho ................... H01L 23/49822 |
| 2020/0395300 | A1* | 12/2020 | Xie ...................... H01L 23/5385 |
| 2020/0395313 | A1* | 12/2020 | Mallik ................... H01L 25/50 |

FOREIGN PATENT DOCUMENTS

| | | |
|---|---|---|
| KR | 10-2020-0069573 A | 6/2020 |
| WO | 2019132965 A1 | 7/2019 |

\* cited by examiner

SEMICONDUCTOR PACKAGE

CROSS-REFERENCE TO THE RELATED APPLICATION

This application claims benefit of priority to Korean Patent Application No. 10-2020-0079871 filed on Jun. 30, 2020 in the Korean Intellectual Property Office, the disclosure of which is incorporated herein by reference in its entirety.

BACKGROUND

Example embodiments of the present disclosure relate to a semiconductor package.

With the trend for reduced sizes and high performance of semiconductor chips, a system in package (SIP) technique for embedding a plurality of semiconductor chips in a single package, and the formation of a microcircuit corresponding to a fine bump pitch of a semiconductor chip have been required in the field of semiconductor packaging.

SUMMARY

According to an example embodiment of the present disclosure, a semiconductor package having improved integration density and manufactured at reduced cost is provided.

According to an example embodiment of the present disclosure, a semiconductor package is provided. The semiconductor package includes: a base substrate including a circuit layer; an interposer package disposed on the base substrate; and a first semiconductor chip and at least one second semiconductor chip disposed on the interposer package. The interposer package includes: a first redistribution structure including one or more insulating layers and a first redistribution layer disposed on each of the one or more insulating layers, and having a first surface on which the first semiconductor chip and the at least one second semiconductor chip are disposed and a second surface opposing the first surface; at least one bridge chip disposed on the second surface of the first redistribution structure and including a bridge circuit configured to electrically connect the first semiconductor chip to one of the at least one second semiconductor chip; a vertical connection structure disposed on the second surface of the first redistribution structure, and including a plurality of wiring layers electrically connected to the first semiconductor chip and the one of the at least one second semiconductor chip and disposed on different levels; an encapsulant disposed on the second surface of the first redistribution structure and encapsulating the at least one bridge chip and the vertical connection structure; and a second redistribution structure disposed on the encapsulant and having a second redistribution layer electrically connected to the plurality of wiring layers of the vertical connection structure. Each of the first semiconductor chip and the one of the at least one second semiconductor chip is electrically connected to the bridge circuit of one or more of the at least one bridge chip and the plurality of wiring layers of the vertical connection structure through the first redistribution layer.

According to an example embodiment of the present disclosure, a semiconductor package is provided. The semiconductor package includes: a base substrate; an interposer package disposed on the base substrate and including at least one bridge chip having a bridge circuit; and at least one first semiconductor chip and at least one second semiconductor chip disposed on the interposer package and each overlapping at least a portion of the at least one bridge chip in a direction perpendicular to an upper surface of the interposer package. The at least one first semiconductor chip includes a plurality of first interconnection pads disposed in a first region overlapping the at least one bridge chip and a plurality of first external connection pads disposed in a second region which does not overlap the at least one bridge chip. The at least one second semiconductor chip includes a plurality of second interconnection pads disposed in a third region overlapping the at least one bridge chip and a plurality of second external connection pads disposed in a fourth region which does not overlap the at least one bridge chip. The plurality of first interconnection pads are connected to the plurality of second interconnection pads through the bridge circuit of the at least one bridge chip. A size of each of the plurality of first interconnection pads and the plurality of second interconnection pads is smaller than a size of each of the plurality of first external connection pads and the plurality of second external connection pads.

According to an example embodiment of the present disclosure, a semiconductor package is provided. The semiconductor package includes: a base substrate including a circuit layer; an interposer package disposed on the base substrate; a first semiconductor chip and a second semiconductor chip disposed on the interposer package; first internal connection bumps disposed between the base substrate and the interposer package; second internal connection bumps and third internal connection bumps disposed between the interposer package and the first semiconductor chip, and disposed between the interposer package and the second semiconductor chip; and an external connection bump disposed on a side of the base substrate that is opposite from a surface of the base substrate that faces the first internal connection bumps, and the external connection bump electrically connected to the circuit layer. Each of the first semiconductor chip and the second semiconductor chip respectively includes: a plurality of first interconnection pads and a plurality of second interconnection pads connected to respective ones of the second internal connection bumps; and a plurality of first external connection pads and a plurality of second external connection pads connected to respective ones of the third internal connection bumps. The interposer package includes: a first redistribution layer including a first redistribution circuit connected to the plurality of first interconnection pads through the second internal connection bumps, a second redistribution circuit connected to the plurality of second interconnection pads through the second internal connection bumps, and a third redistribution circuit connected to the plurality of first external connection pads and the plurality of second external connection pads through the third internal connection bumps, and the first redistribution layer is a part of a first redistribution structure that has a first surface on which the first semiconductor chip and the second semiconductor chip are disposed and a second surface opposing the first surface; a bridge chip disposed on the second surface of the first redistribution structure and electrically connecting the first redistribution circuit to the second redistribution circuit; a vertical connection structure disposed on the second surface of the first redistribution structure, the vertical connection structure including a first through-hole accommodating the bridge chip and further including a plurality of wiring layers electrically connected to the third redistribution circuit; an encapsulant encapsulating the vertical connection structure and the bridge chip; and a second redistribution structure disposed on the encapsulant and having a second redistribution layer electrically connected to the plurality of wiring layers of the vertical connection structure, where the second redistribution layer is connected to the circuit layer of the base substrate through the first internal connection bumps. A pitch of each of the plurality of first interconnection pads and the plurality of second interconnection pads is smaller than a pitch of each of the plurality of first external connection pads and the plurality of second external connection pads.

BRIEF DESCRIPTION OF DRAWINGS

The above and other aspects, features, and advantages of embodiments of the present disclosure will be more clearly understood from the following detailed description, taken in conjunction with the accompanying drawings, in which.

DETAILED DESCRIPTION

Hereinafter, embodiments of the present disclosure will be described as follows with reference to the accompanying drawings.

Figure 1:
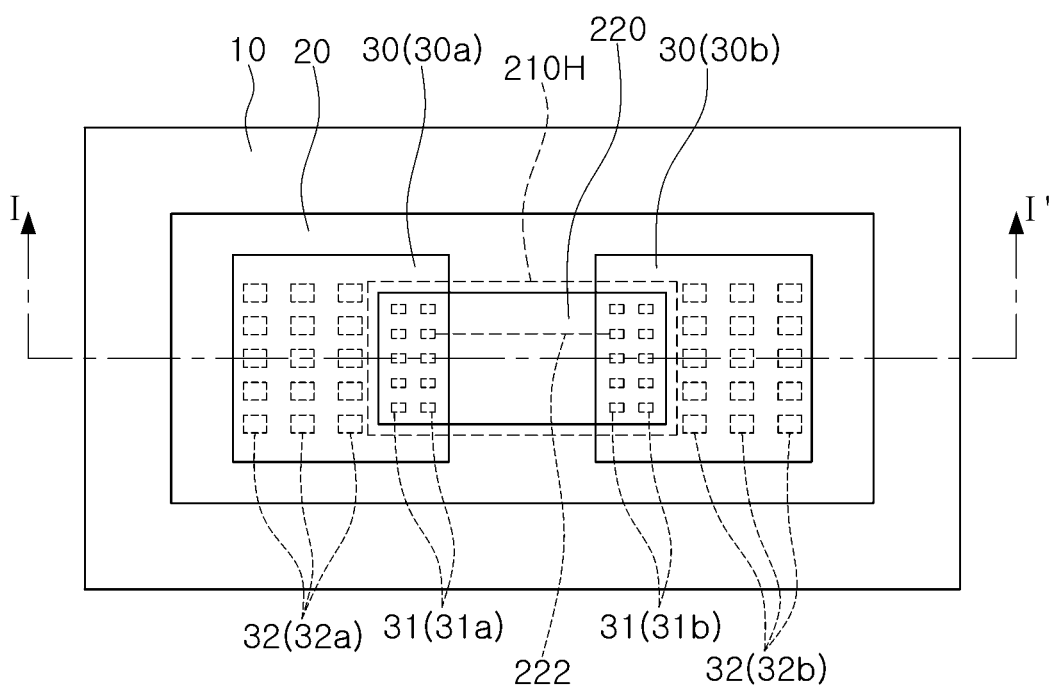
FIG. 1 is a plan diagram illustrating a semiconductor package according to an example embodiment of the present disclosure.
Figure 2:
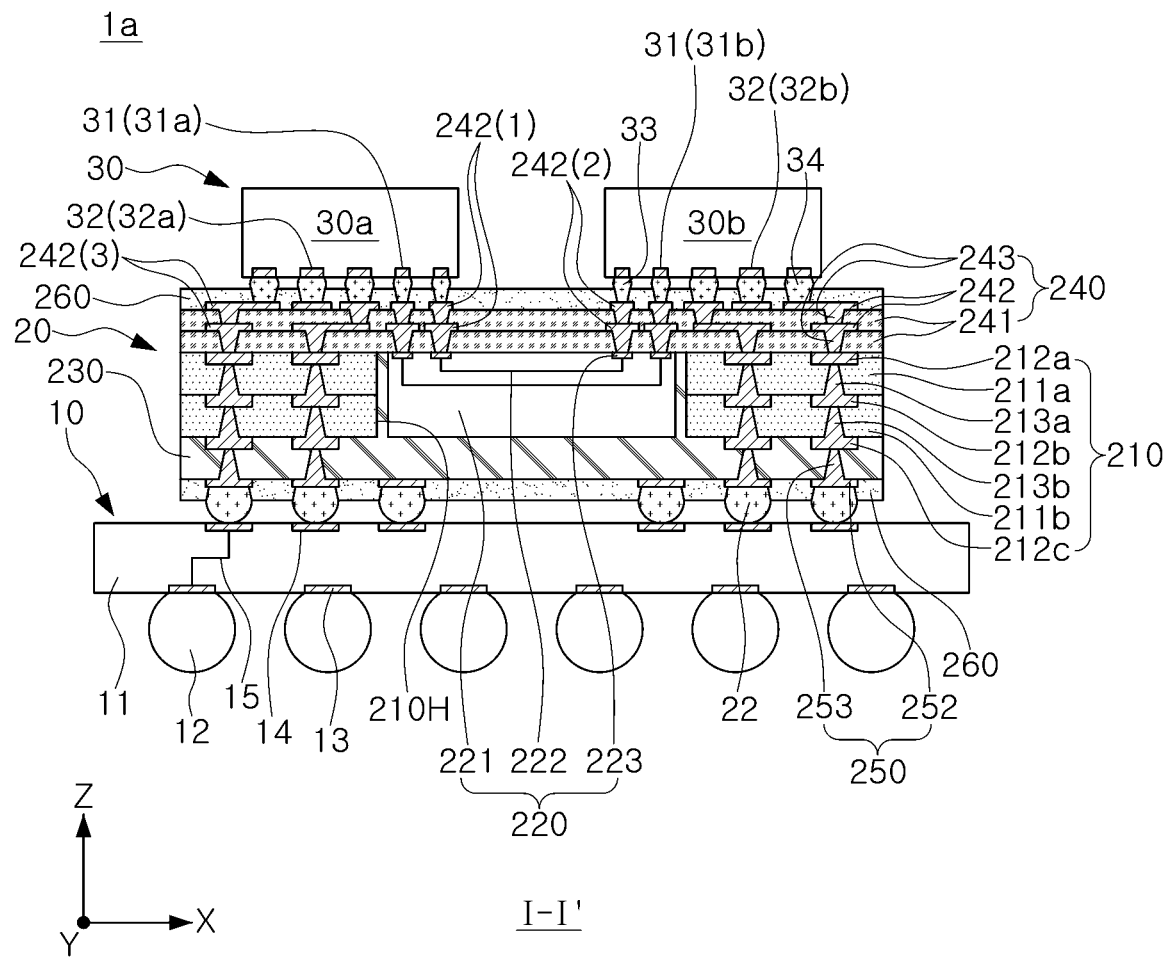
FIG. 2 is a cross-sectional diagram illustrating a semiconductor package illustrated in FIG. 1 along line I-I'.

FIG. 1 is a plan diagram illustrating a semiconductor package 1a according to an example embodiment, and FIG. 2 is a cross-sectional diagram illustrating a semiconductor package 1a illustrated in FIG. 1 along line I-I'.

Referring to FIGS. 1 and 2, the semiconductor package 1a in the example embodiment may include a base substrate 10, an interposer package 20, and a plurality of semiconductor chips 30 and may further include first internal connection bumps 22, second internal connection bumps 33, third internal connection bumps 34, and external connection bumps 12.

The base substrate 10 may be configured as a support substrate on which the interposer package 20 and the plurality of semiconductor chips 30 are mounted in a direction (Z direction) perpendicular to an upper surface, and may include a substrate body 11, substrate connection pads 13 and substrate connection pads 14 disposed on a lower surface and an upper surface of the substrate body 11, respectively, and a circuit layer 15 for electrically connecting the substrate connection pads 13 and the substrate connection pads 14 to each other. The base substrate 10 may be configured as a substrate for a semiconductor package including a printed circuit board (PCB), a ceramic substrate, a glass substrate, and a tape wiring board.

The substrate body 11 may include different materials depending on the type of the base substrate 10. For example, when the base substrate 10 is a printed circuit board, the substrate body 11 may be configured as a copper clad laminate or a copper clad laminate including a wiring layer stacked on a cross-sectional surface or both surfaces thereof. A lower protective layer and an upper protective layer coated with a solder resist may be formed on the lower surface and the upper surface of the substrate body 11, respectively.

The substrate connection pads 13 and the substrate connection pads 14 may include an alloy including at least one metal or two or more metals from among copper (Cu), aluminum (Al), nickel (Ni), silver (Ag), gold (Au), platinum (Pt), tin (Sn), lead (Pb), titanium (Ti), chromium (Cr), palladium (Pd), indium (In), zinc (Zn), and carbon (C).

The circuit layer 15 may form an electrical path for connecting a lower surface and an upper surface of the base substrate 10 to each other. The circuit layer 15 may include a single wiring layer or multiple wiring layers formed in the substrate body 11 and vias for connecting the wiring layers. The circuit layer 15 may include an alloy including at least one metal or two or more metals from among copper (Cu), aluminum (Al), nickel (Ni), silver (Ag), gold (Au), platinum (Pt), tin (Sn), lead (Pb), titanium (Ti), chromium (Cr), palladium (Pd), indium (In), zinc (Zn), and carbon (C).

The interposer package 20 may be disposed on the upper surface of the base substrate 10, and may include a first redistribution structure 240, a bridge chip 220, a vertical connection structure 210, an encapsulant 230, and a second redistribution structure 250.

The first redistribution structure 240 may have a first surface on which the plurality of semiconductor chips 30 are disposed and a second surface opposite to the first surface, one or more insulating layers 241, and one or more first redistribution layers 242 disposed on the one or more insulating layers 241, respectively, and one or more first redistribution vias 243 penetrating each of the one or more insulating layers 241 and electrically connecting the one or more first redistribution layers 242 to a wiring layer of the vertical connection structure 210 or the bridge chip 220 or electrically connecting the first redistribution layers 242 disposed on different levels to each other.

The insulating layers 241 may include an insulating material. The insulating material may include a thermosetting resin such as an epoxy resin, a thermoplastic resin such as a polyimide resin, a resin in which an inorganic filler and/or a glass fiber (or a glass cloth or a glass fabric) is impregnated in the thermosetting resin or the thermoplastic resin, such as, prepreg, an Ajinomoto build-up film (ABF), FR-4, bismaleimide triazine (BT), or the like. Also, the insulating layers 241 may include a photosensitive resin such as photo-imageable dielectric (PID) resin. In this case, the insulating layers 241 may have a decreased thickness, and the first redistribution vias 243 may be formed finely. When multiple insulating layers 241 are provided as an insulating layer, the insulating layers 241 may include the same material or different materials, and a boundary between the insulating layers 241 disposed on different levels may be indistinct, depending on processes.

The first redistribution layers 242 may be disposed on the insulating layers 241 and may oppose the plurality of semiconductor chips 30. The first redistribution layers 242 may substantially redistribute interconnection pads 31 and external connection pads 32 of the plurality of semiconductor chips 30. The first redistribution layers 242 may include a metal material including copper (Cu), aluminum (Al), silver (Ag), tin (Sn), gold (Au), nickel (Ni), lead (Pb), and titanium (Ti), or an alloy thereof, for example. The first redistribution layers 242 may perform various functions depending on a design. For example, the first redistribution layers 242 may include a ground (GrouND: GND) pattern, a power (PoWeR: PWR) pattern, and a signal (Signal: S) pattern. The signal (S) pattern may include various signals other than a ground (GND) pattern, a power (PWR) pattern, such as a data signal, for example. The ground (GND) pattern and the power (PWR) pattern may be the same pattern.

The first redistribution layers 242 may include a first redistribution circuit 242(1) for connecting the first semiconductor chip 30a to a bridge circuit 222, a second redistribution circuit 242(2) for connecting the second semiconductor chip 30b to the bridge circuit 222, and a third redistribution circuit 242(3) for connecting the first semiconductor chip 30a and the second semiconductor chip 30b to a first wiring layer 212a of the vertical connection structure 210. The first redistribution circuit 242(1) may be connected to first interconnection pads 31a of the first semiconductor chip 30a through the second internal connection bumps 33, the second redistribution circuit 242(2) may be connected to second interconnection pads 31b of the second semiconductor chip 30b through the second internal connection bumps 33, and the third redistribution circuit 242(3) may be connected to first external connection pads 32a of the first semiconductor chip 30a and second external connection pads 32b of the second semiconductor chip 30b through third internal connection bumps 34. The first redistribution circuit 242(1) may be electrically connected to the second redistribution circuit 242(2) through the bridge circuit 222 of the bridge chip 220. Accordingly, the first semiconductor chip 30a may be electrically connected to the second semiconductor chip 30b through the first redistribution circuit 242(1), the second redistribution circuit 242(2), and the bridge circuit 222. The third redistribution circuit 242(3) may be electrically connected to each of the plurality of semiconductor chips 30, and may be electrically connected to a circuit layer 15 of the base substrate 10 through a vertical connection structure 210 and the second redistribution structure 250.

Each of the first redistribution circuit 242(1) and the second redistribution circuit 242(2) may have a pad portion having a size or a pitch smaller than those of a pad portion of the third redistribution circuit 242(3) to correspond to a fine pitch of the interconnection pads 31 of the plurality of semiconductor chips 30. As the first redistribution circuit 242(1), the second redistribution circuit 242(2), and the third redistribution circuit 242(3) are formed in the same process (e.g., a photolithography process), lines and spaces (L/S) and line widths of the first redistribution circuit 242(1), the second redistribution circuit 242(2), and the third redistribution circuit 242(3) may be substantially the same.

The first redistribution vias 243 may connect the first redistribution layers 242 formed on different levels to each other or may electrically connect the first redistribution layers 242 to the vertical connection structure 210 and the bridge chip 220, thereby forming an electrical path in the interposer package 20. The first redistribution vias 243 may include a signal via, a ground via, and a power via. The first redistribution vias 243 may include a metal material including copper (Cu), aluminum (Al), silver (Ag), tin (Sn), gold (Au), nickel (Ni), lead (Pb), titanium (Ti), or an alloy thereof, for example. The first redistribution vias 243 may be configured as filled vias in which a metal material is filled in a via hole or conformal vias in which a metal material is formed along an internal wall of the via hole.

The bridge chip 220 may be disposed on a second surface of the first redistribution structure 240, and may include a chip body 221, the bridge circuit 222, and front-surface bridge pads 223. The bridge chip 220 may be configured to have a size or a horizontal area in which the chip body 221 may partially overlap the plurality of semiconductor chips 30 in a vertical direction (Z direction) to connect the plurality of semiconductor chips 30 to each other. The bridge chip 220 may include a process chip, a logic chip, and a memory chip.

The chip body 221 may be formed using ceramic, glass, semiconductor, or the like. For example, the chip body 221 may be formed using an active wafer, and may include silicon (Si), germanium (Ge), gallium arsenide (GaAs), or the like. A passivation layer may be formed on one surface of the chip body 221 to protect the chip body 221 from external physical or chemical damages. The passivation layer may be configured as an oxide layer or a nitride layer, or may be configured as a double layer including an oxide layer and a nitride layer. For example, the passivation layer may be formed of a silicon oxide film ($SiO_2$), a silicon nitride film ($SiN_x$), or a combination thereof.

The bridge circuit 222 may be formed on one surface of the chip body 221, that is, in a passivation layer formed on one surface of the chip body 221, for example. The bridge circuit 222 may have a pitch corresponding to a fine pitch of the interconnection pads 31 of the plurality of semiconductor chips 30, and may electrically connect the first redistribution circuit 242(1) to the second redistribution circuit 242(2). Accordingly, a line and space (L/S) of the bridge circuit 222 may be 2 μm or less. For example, the bridge circuit 222 has bridge patterns in a form of line and space, and a line width of each of the bridge patterns is 2 μm or less, and a distance between adjacent bridge patterns among the bridge patterns is 2 μm or less. The bridge circuit 222 may serve as a bridge for electrically connecting the plurality of semiconductor chips 30 to each other by connecting the interconnection pads 31 included in the plurality of semiconductor chips 30 to each other. The bridge circuit 222 may have a finer pitch, finer than that of the first redistribution layers 242. For example, a line width of the bridge circuit 222 may be smaller than a line width of the first redistribution layer.

The front-surface bridge pads 223 may be disposed on one surface of the chip body 221, that is, on a surface of the passivation layer formed on one surface of the chip body 221 or in the passivation layer, for example, and may provide a connection place in which the bridge circuit 222 is connected to the first redistribution circuit 242(1) and the second redistribution circuit 242(2).

The vertical connection structure 210 may be disposed on a second surface of the first redistribution structure 240 and may include frame insulating layers (e.g., first frame insulating layer 211a and second frame insulating layer 211b), a plurality of wiring layers (e.g., first wiring layer 212a, second wiring layer 212b, and third wiring layer 212c) disposed on different levels of the frame insulating layers, and wiring vias (e.g., first wiring via 213a and second wiring via 213b) for electrically connecting the plurality of wiring layers to each other. Also, the vertical connection structure 210 may have a through-hole 210H penetrating the frame insulating layers and accommodating the bridge chip 220. The vertical connection structure 210 may improve rigidity of the package depending on a material of the frame insulating layers, and may secure a uniform thickness of the encapsulant 230. The through-hole 210H may have a shape in which a wall surface thereof continuously surrounds the bridge chip 220, but an example embodiment thereof is not limited thereto.

For example, the vertical connection structure 210 may include a first frame insulating layer 211a in contact with the second surface of the first redistribution structure 240, a first wiring layer 212a in contact with the second surface of the first redistribution structure 240 and buried in the first frame insulating layer 211a, a second wiring layer 212b disposed on a surface opposing the surface of the first frame insulating layer 211a in which the first wiring layer 212a is buried, a second frame insulating layer 211b disposed on the first frame insulating layer 211a and covering a second wiring layer 212b, a third wiring layer 212c disposed on the second frame insulating layer 211b, a first wiring via 213a penetrating the first frame insulating layer 211a and electrically connecting the first wiring layer 212a to the second wiring layer 212b, and a second wiring via 213b penetrating the second frame insulating layer 211b and electrically connecting the second wiring layer 212b to the third wiring layer 212c.

The first frame insulating layer 211a and the second frame insulating layer 211b may include an insulating material. For example, as the insulating material, a thermosetting resin such as epoxy resin, a thermoplastic resin such as polyimide, or a resin in which inorganic fillers or/and glass fibers (Glass Fiber, Glass Cloth, Glass Fabric) are mixed with the above-mentioned resin. For example, an Ajinomoto build-up film (ABF), prepreg, or the like, may be used.

The plurality of wiring layers (e.g. the first wiring layer 212a, the second wiring layer 212b, and the third wiring layer 212c) may provide an electrical path for connecting upper and lower portions of the package along with the first wiring via 213a and the second wiring via 213b. The plurality of wiring layers may include copper (Cu), aluminum (Al), silver (Ag), tin (Sn), gold (Au), nickel (Ni), lead (Pb), titanium (Ti), or an alloy thereof. The plurality of wiring layers may include a ground (GrouND: GND) pattern, a power (PoWeR: PWR) pattern, and a signal (S) pattern depending on a design of the respective layer. Also, each of the plurality of wiring layers may include various types of via pads. The plurality of wiring layers may be formed by a general plating process, and each of the plurality of wiring may include a seed layer and a conductor layer.

The first wiring via 213a and the second wiring via 213b may form an electrical path electrically connecting the plurality of wiring layers (e.g. the first wiring layer 212a, the second wiring layer 212b, and the third wiring layer 212c) formed on different levels to each other and vertically penetrating the vertical connection structure 210. The first wiring via 213a and the second wiring via 213b may include copper (Cu), aluminum (Al), silver (Ag), tin (Sn), gold (Au), nickel (Ni), lead (Pb), titanium (Ti), or an alloy thereof. The first wiring via 213a and the second wiring via 213b may include a signal via, a power via, and a ground via, and the power via and the ground via may be the same. Each of the first wiring via 213a and the second wiring via 213b may be configured as a field type via filled with a metal material, or a conformal type via in which a metal material is formed along a wall surface of the via hole. The first wiring via 213a and the second wiring via 213b may be formed by a plating process, and may include a seed layer and a conductor layer.

The encapsulant 230 may be disposed on the second surface of the first redistribution structure 240 and may seal at least a portion of the vertical connection structure 210 and the bridge chip 220. The encapsulant 230 may include prepreg, an Ajinomoto build-up film (ABF), FR-4, Bismaleimide Triazine (BT), epoxy molding compound (EMC) which include a thermosetting resin such as an epoxy resin, a thermoplastic resin such as polyimide, or an inorganic filler or/and glass fibers. The encapsulant 230 may include an insulating material different from an insulating material of the insulating layers 241 of the first redistribution structure 240 and the frame insulating layers (e.g., the first frame insulating layer 211a and the second frame insulating layer 211b) of the vertical connection structure 210.

The second redistribution structure 250 may be disposed on the encapsulant 230, and may include a second redistribution layer 252 opposing the base substrate 10, and a second redistribution via 253 partially penetrating the encapsulant 230 and electrically connecting the second redistribution layer 252 to the third wiring layer 212c of the vertical connection structure 210. As the second redistribution layer 252 and the second redistribution via 253 have characteristics substantially similar to those of the first redistribution layers 242 and the first redistribution vias 243 described above, the descriptions thereof will not be repeated.

The interposer package 20 may further include a protective layer 260 for covering the first redistribution layers 242 and the second redistribution layer 252. The protective layer 260 may protect the first redistribution layers 242 and the second redistribution layer 252 disposed on an outermost side from external physical and chemical damages. The protective layer 260 may have a plurality of openings for exposing at least a portion of the first redistribution layers 242 and the second redistribution layer 252 disposed on the outermost side. The protective layer 260 may include an insulating material, such as prepreg, ABF, FR-4, BT, or a solder resist, for example.

The plurality of semiconductor chips 30 may be spaced apart from each other in a horizontal direction (X direction and Y direction) on the interposer package 20. Each of the plurality of semiconductor chips 30 may overlap at least a portion of the bridge chip 220 of the interposer package 20 in the vertical direction (Z direction), perpendicular to an extending direction of the interposer package 20. Each of the plurality of semiconductor chips 30 may include interconnection pads 31 connected to each other through the first redistribution layers 242 and the bridge circuit 222, and external connection pads 32 connected to the circuit layer 15 of the base substrate 10 through the first wiring layer 212a, the second wiring layer 212b, and the third wiring layer 212c of the vertical connection structure 210.

For example, the plurality of semiconductor chips 30 may be disposed on the interposer package 20 and may include the first semiconductor chip 30a and the second semiconductor chip 30b overlapping at least a portion of the bridge chip 220. The first semiconductor chip 30a and the second semiconductor chip 30b may include different types of semiconductor chips. For example, the first semiconductor chip 30a may include an application processor chip such as a central processor (e.g., a CPU), a graphics processor (e.g., a GPU), a digital signal processor, an encryption processor, a microprocessor, and a microcontroller, and a logic chip such as an analog-digital converter, an application-specific IC (ASIC), or the like, and the second semiconductor chip 30b may include a memory chip such as a volatile memory (e.g., DRAM), a non-volatile memory (e.g., ROM), and a flash memory. Alternatively, the first semiconductor chip 30a and the second semiconductor chip 30b may include the same type of semiconductor chips. For example, both the first semiconductor chip 30a and the second semiconductor chip 30b may include a logic chip.

The first semiconductor chip 30a may include a plurality of first interconnection pads 31a disposed in a region overlapping the bridge chip 220 in the vertical direction (Z direction), and a plurality of first external connection pads 32a disposed in a region which does not overlap the bridge chip 220, and the second semiconductor chip 30b may include a plurality of second interconnection pads 31b disposed in a region overlapping the bridge chip 220 and a plurality of second external connection pads 32b disposed in a region which does not overlap the bridge chip 220.

In the example embodiment, in the interposer package 20, as a circuit for connecting the first semiconductor chip 30a to the second semiconductor chip 30b, a microcircuit of the bridge chip 220 manufactured by a semiconductor fab process may be used, and as a circuit for connecting the first semiconductor chip 30a and the second semiconductor chip 30b to the base substrate 10 or redistributing external connection pads of the first semiconductor chip 30a and the second semiconductor chip 30b to each other, wiring layers and redistribution layers of the vertical connection structure 210 and the first redistribution structure 240 manufactured by a substrate process such as a semi-additive process (SAP), a modified semi-additive process (MSAP), or a photolithography process may be used, such that the plurality of semiconductor chips 30 may be mounted on a single package and costs for manufacturing the package may be reduced.

Accordingly, the plurality of first interconnection pads 31a and the plurality of second interconnection pads 31b may be electrically connected to each other through the bridge circuit 222, and sizes and/or pitches of the plurality of first interconnection pads 31a and the plurality of second interconnection pads 31b may be smaller than sizes and/or pitches of the plurality of first external connection pads 32a and the plurality of second external connection pads 32b. Also, the plurality of first interconnection pads 31a and the plurality of second interconnection pads 31b may be densely disposed in a region in which the first and second semiconductor chips 30a and 30b overlap the bridge chip 220 in the vertical direction (Z direction).

The external connection bumps 12, the first internal connection bumps 22, the second internal connection bumps 33, and the third interconnection bumps 34 may have a flip-chip connection structure having a solder ball, a conductive bump or a grid array such as a pin grid array, a ball grid array, and a land grid array, for example. The external connection bumps 12 may be electrically connected to the substrate connection pads 13 disposed on the lower surface of the base substrate 10 and may be electrically connected to an external device such as a module board and a system board.

The first internal connection bumps 22 may be disposed between the base substrate 10 and the interposer package 20, and may electrically connect the second redistribution layer 252 of the second redistribution structure 250 to the circuit layer 15 of the base substrate 10. The second internal connection bump 33 may connect the first interconnection pads 31a of the first semiconductor chip 30a and the second interconnection pads 31b of the second semiconductor chip 30b to the first redistribution layers 242 of the first redistribution structure 240. The third internal connection bumps 34 may connect the first external connection pads 32a of the first semiconductor chip 30a and the second external connection pads 32b of the second semiconductor chip 30b to the first redistribution layers 242 of the first redistribution structure 240. A size of the first internal connection bumps 22 may be larger than a size of each of the second internal connection bumps 33 and the third internal connection bumps 34, and a size of the third internal connection bumps 34 may be larger than a size of the second internal connection bumps 33.

Figure 3:
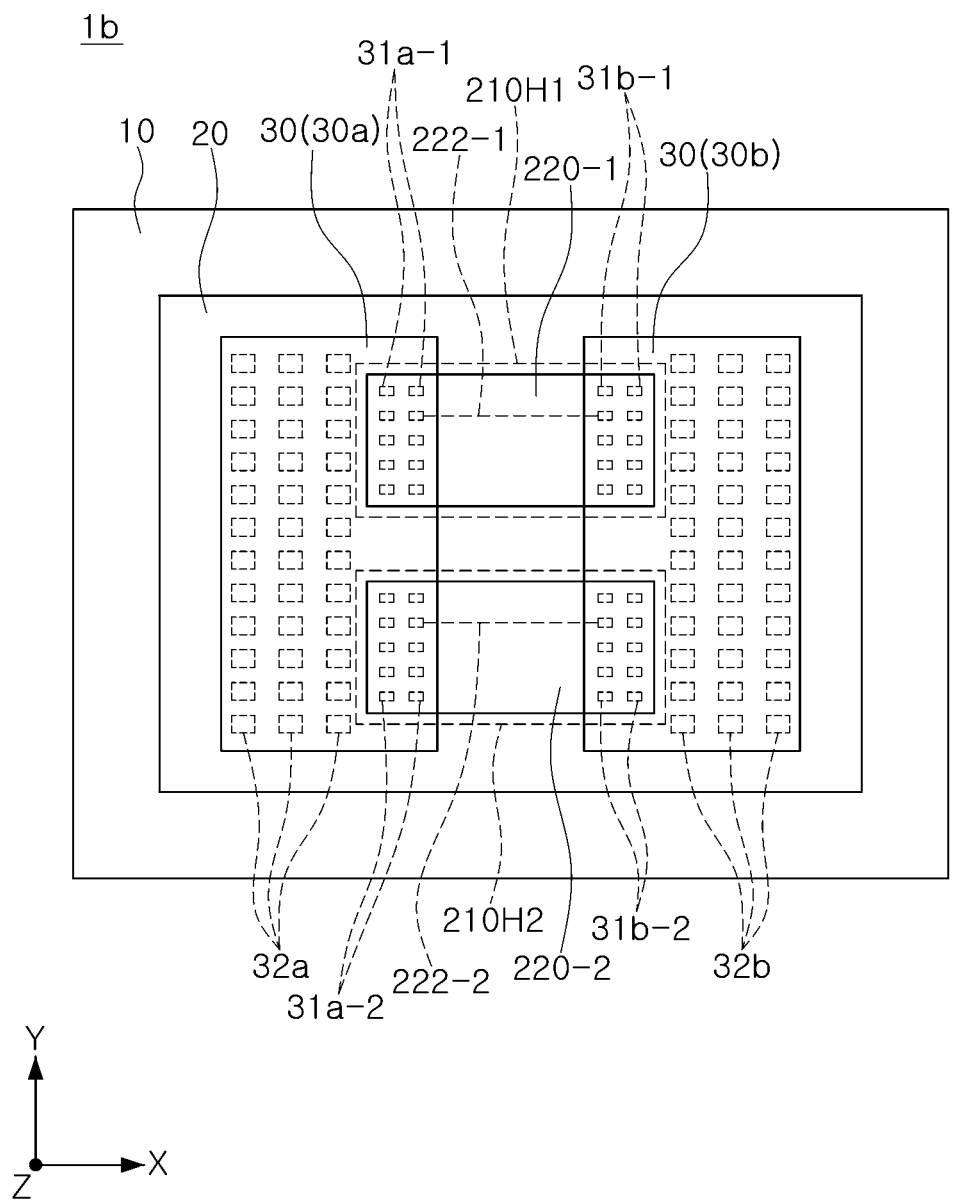
FIG. 3 is a plan diagram illustrating a semiconductor package according to an example embodiment of the present disclosure.

FIG. 3 is a plan diagram illustrating a semiconductor package 1b according to an example embodiment.

Referring to FIG. 3, a semiconductor package 1b may include a plurality of bridge chips (e.g., first bridge chip 220-1 and second bridge chip 220-2) overlapping a first semiconductor chip 30a and a second semiconductor chip 30b, respectively, and an interposer package 20 or the vertical connection structure 210 (in FIG. 2) of the interposer package 20 may include a plurality of through-holes (e.g., a first through-hole 210H1 and a second through-hole 210H2) for accommodating a plurality of bridge chips (e.g., first bridge chip 220-1 and second bridge chip 220-2), respectively. Shapes and relative sizes of the first semiconductor chip 30a, the second semiconductor chip 30b, and the plurality of bridge chips and dispositional relationships among the first semiconductor chip 30a, the second semiconductor chip 30b, and the plurality of bridge chips may be varied in the example embodiments.

For example, the interposer package 20 may include the first bridge chip 220-1 disposed in the first through-hole 210H1 and the second bridge chip 220 disposed in the second through-hole 210H2, and the first semiconductor chip 30a and the second semiconductor chip 30b may have regions overlapping the first bridge chip 220-1 and the second bridge chip 220-2, respectively. The first interconnection pads 31a-1 disposed in a region overlapping with the first bridge chip 220-1 may be electrically connected to the second interconnection pads 31b-1 disposed in a region overlapping the first bridge chip 220-1 through the first bridge circuit 222-1. Also, the first interconnection pads 31a-2 disposed in a region overlapping the second bridge chip 220-2 may be electrically connected to the second interconnection pads 31b-2 disposed in a region overlapping the second bridge chip 220-2 through the second bridge circuit 222-2.

As the elements illustrated in FIG. 3 which have the same reference numerals as in FIGS. 1 and 2 have technical features similar to those of the elements illustrated in FIGS. 1 and 2, the description thereof will not be repeated.

Figure 4:
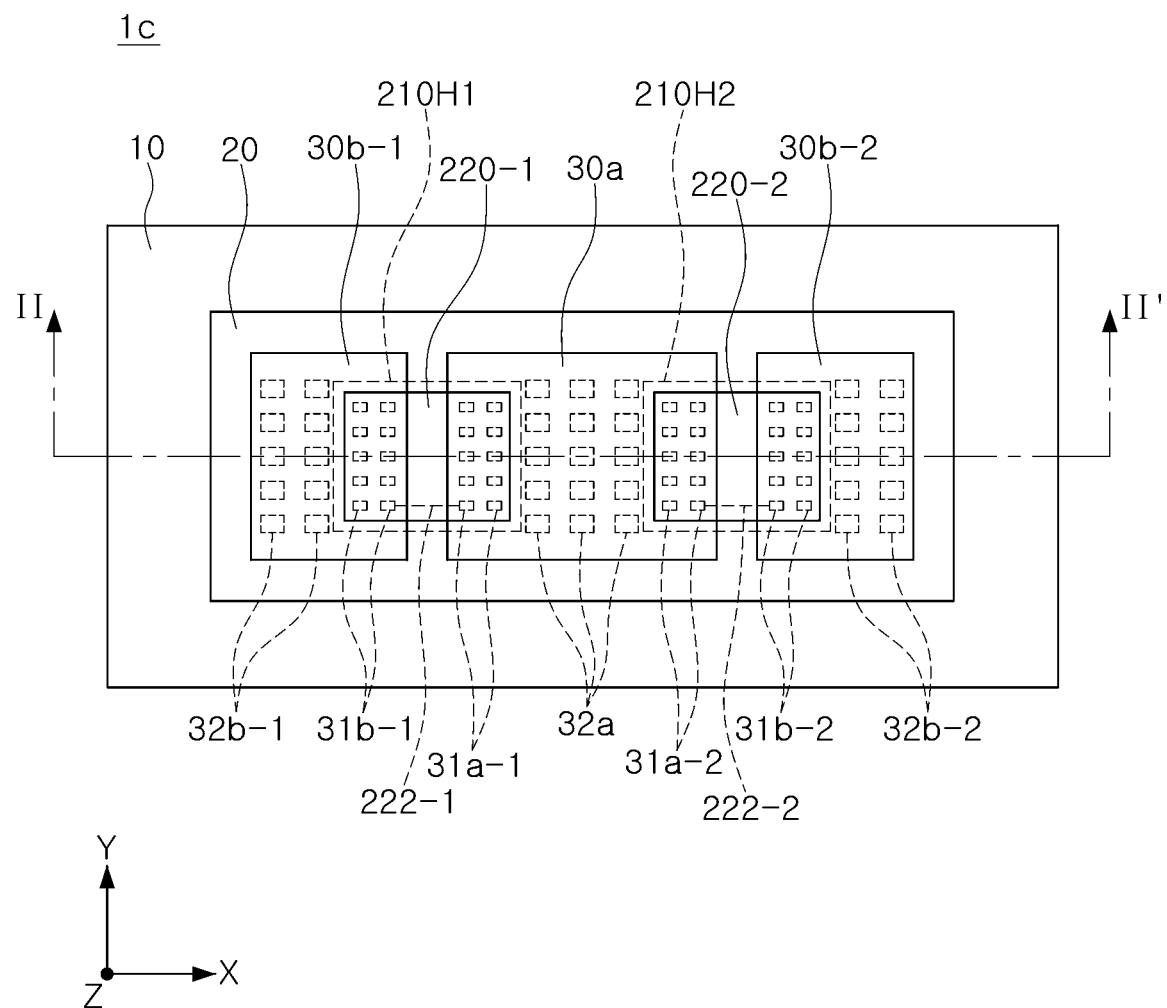
FIG. 4 is a plan diagram illustrating a semiconductor package according to an example embodiment of the present disclosure.
Figure 5:
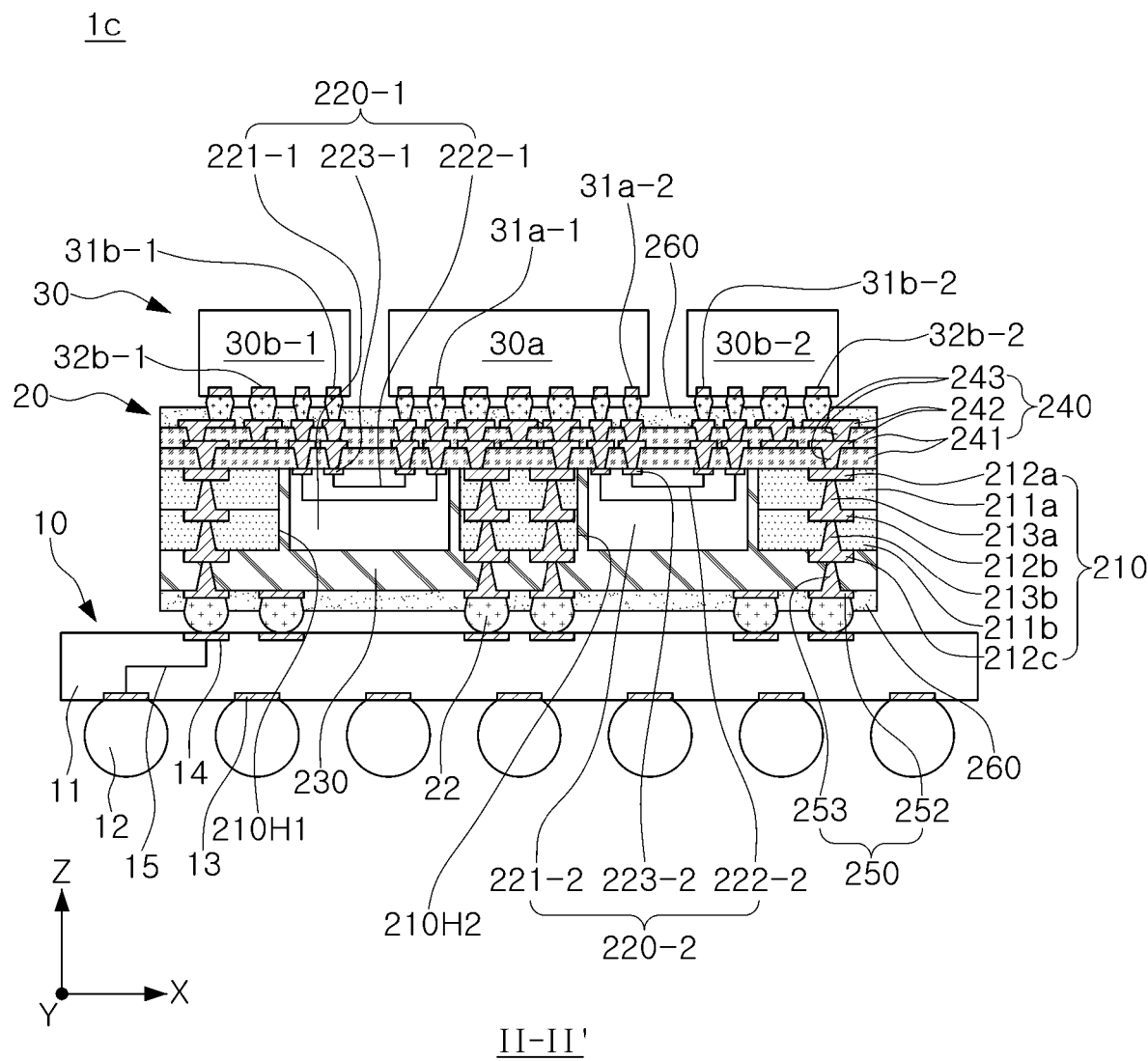
FIG. 5 is a cross-sectional diagram illustrating a semiconductor package illustrated in FIG. 4 along line II-II'.

FIG. 4 is a plan diagram illustrating a semiconductor package 1c according to an example embodiment. FIG. 5 is a cross-sectional diagram illustrating a semiconductor package 1c illustrated in FIG. 4 along line FIG. 6 is a plan diagram illustrating a semiconductor package 1d according to an example embodiment.

Referring to FIGS. 4 and 5, the semiconductor package 1c may include a plurality of second semiconductor chips (e.g. a second semiconductor chip 30b-1 and a second semiconductor chip 30b-2) surrounding the first semiconductor chip 30a, and a plurality of bridge chips (e.g., a first bridge chip 220-1 and a second bridge chip 220-2) electrically connecting the plurality of second semiconductor chips (e.g. the second semiconductor chip 30b-1 and the second semiconductor chip 30b-2) to the first semiconductor chip 30a. The interposer package 20 or the vertical connection structure 210 (in FIG. 4) of the interposer package 20 may include a plurality of through-holes (e.g. a first through-hole 210H1 and a second through-hole 210H2) for accommodating the plurality of bridge chips (e.g., the first bridge chip 220-1 and the second bridge chip 220-2), respectively. The plurality of second semiconductor chips (e.g. the second semiconductor chip 30b-1 and the second semiconductor chip 30b-2) may be spaced apart from each other in the horizontal direction (X direction). The first semiconductor chip 30a may be disposed between the plurality of second semiconductor chips (e.g. the second semiconductor chip 30b-1 and the second semiconductor chip 30b-2) spaced apart from each other, but the dispositional relationship between the first semiconductor chip 30a and the plurality of second semiconductor chips is not limited thereto. The plurality of second semiconductor chips may be disposed adjacent to upper and lower surfaces as well as left and right surfaces of the first semiconductor chip. For example, the plurality of second semiconductor chips may include four or more second semiconductor chips.

According to example embodiments, the interposer package 20 may include a first bridge chip 220-1 disposed in the first through-hole 210H1, and a second bridge chip 220-2 disposed in the second through-hole 210H2, and the first semiconductor chip 30a, the second semiconductor chip 30b-1, and the second semiconductor chip 30b-2 may have regions overlapping the first bridge chip 220-1 and the second bridge chip 220-2. The first interconnection pads 31a-1 disposed in a region overlapping the first bridge chip 220-1 may be electrically connected to the second interconnection pads 31b-1 disposed in a region overlapping the first bridge chip 220-1 through the first bridge circuit 222-1. Also, the first interconnection pads 31a-2 disposed in a region overlapping the second bridge chip 220-2 may be electrically connected to the second interconnection pads 31b-2 disposed in a region overlapping the second bridge chip 220-2 through the second bridge circuit 222-2.

Figure 6:
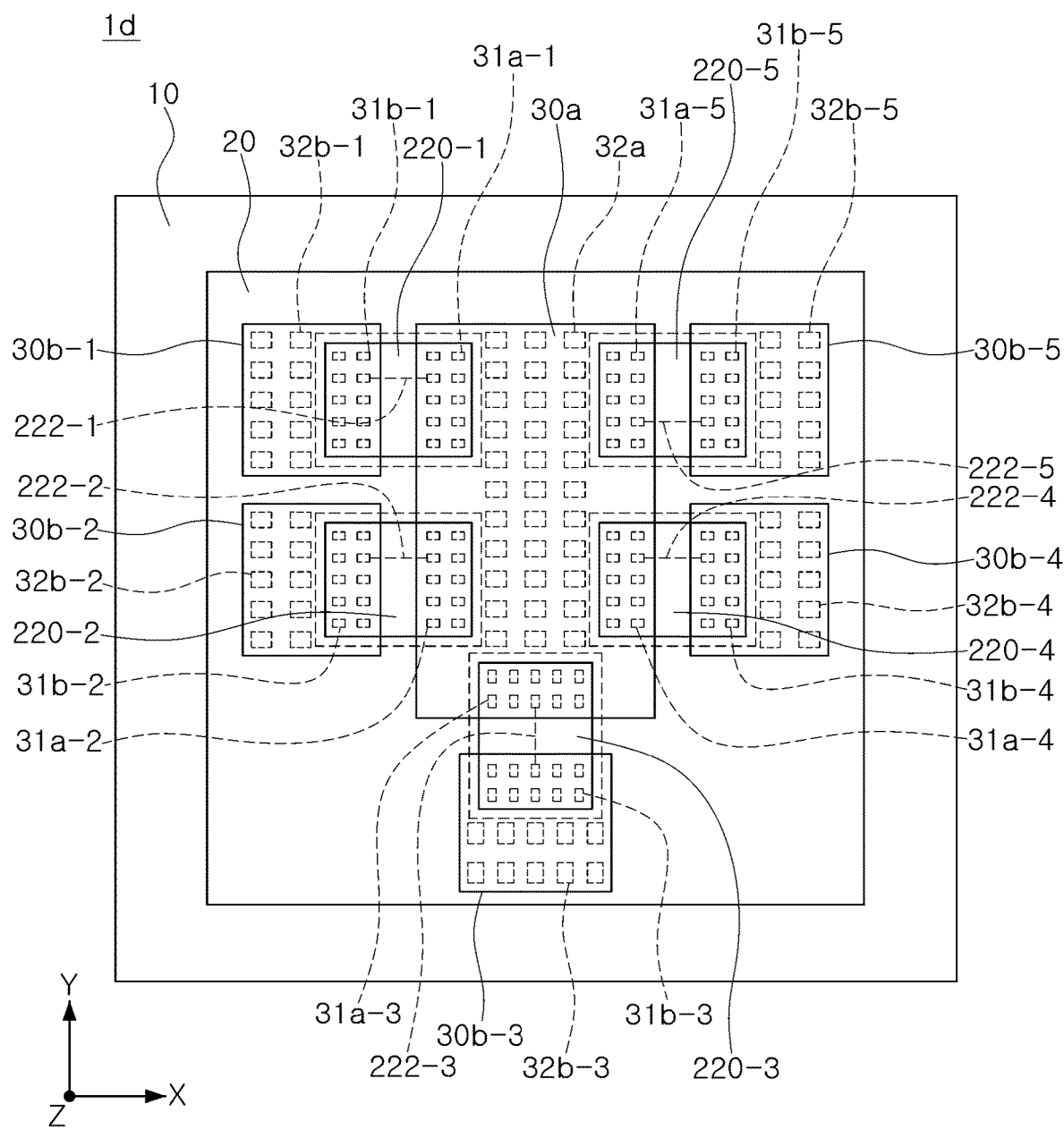
FIG. 6 is a plan diagram illustrating a semiconductor package according to an example embodiment of the present disclosure.

According to example embodiments, as illustrated in FIG. 6, the semiconductor package 1d may include a plurality of second semiconductor chips 30b-1, 30b-2, 30b-3, 30b-4, and 30b-5 surrounding three surfaces of the first semiconductor chip 30a, and a plurality of bridge chips 220-1, 220-2, 220-3, 220-4, and 220-5 for electrically connecting the plurality of second semiconductor chips 30b-1, 30b-2, 30b-3, 30b-4, and 30b-5 to the first semiconductor chip 30a.

As the elements illustrated in FIGS. 4 to 6 which have the same reference numerals as in FIGS. 1 and 2 have technical features similar to those of the elements illustrated in FIGS. 1 and 2, descriptions thereof will not be repeated.

Figure 7:
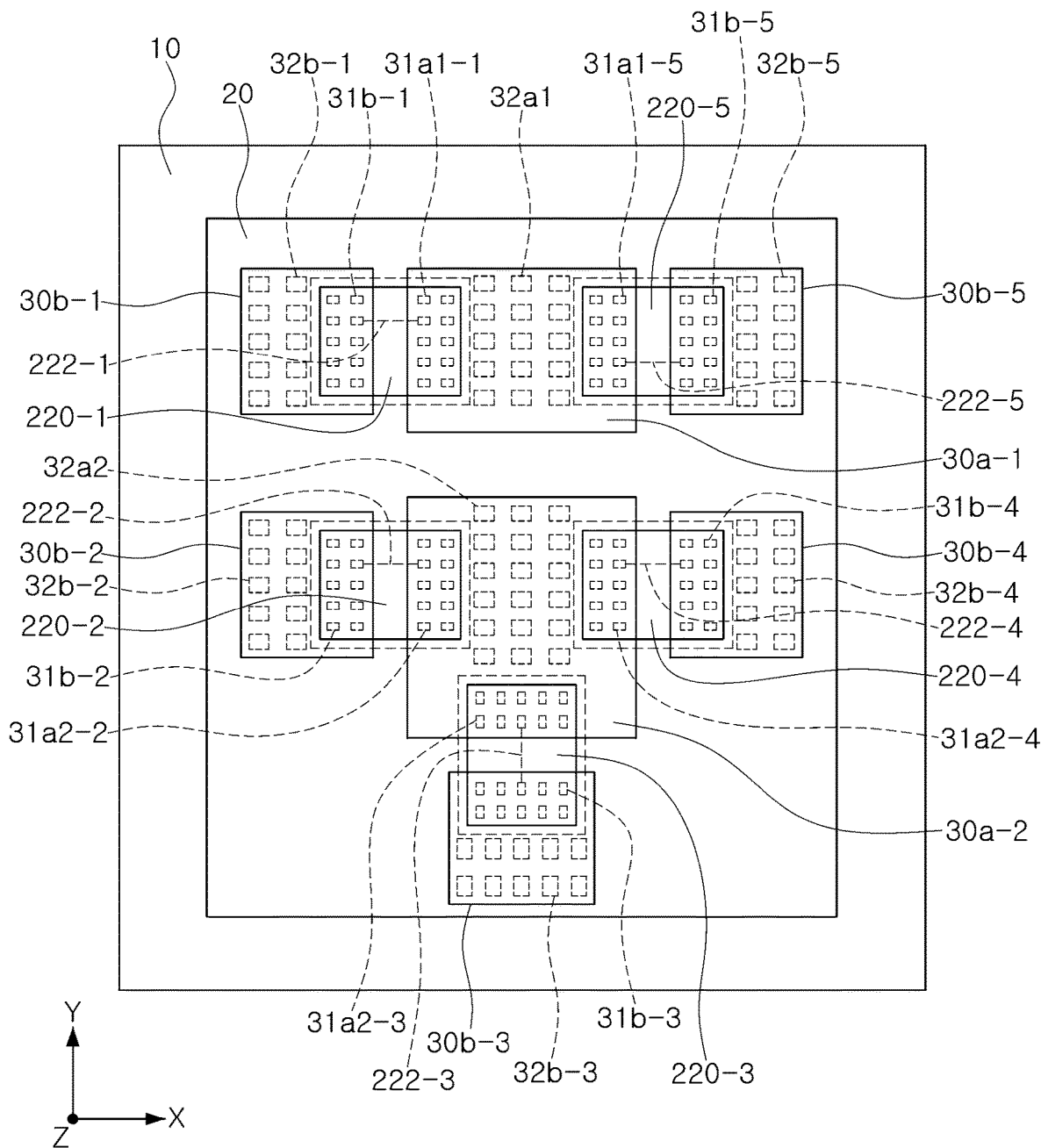
FIG. 7 is a plan diagram illustrating a semiconductor package according to an example embodiment of the present disclosure.

FIG. 7 is a plan diagram illustrating a semiconductor package 1e according to an example embodiment.

Referring to FIG. 7, a semiconductor package 1e may include a plurality of first semiconductor chips 30a-1 and 30a-2 spaced apart from each other in the horizontal direction (X direction and Y direction), a plurality of second semiconductor chips 30b-1, 30b-2, 30b-3, 30b-4, and 30b-5 surrounding the plurality of first semiconductor chips 30a-1 and 30a-2, and a plurality of bridge chips (e.g., a first bridge chip 220-1, a second bridge chip 220-2, a third bridge chip 220-3, a fourth bridge chip 220-4, and a fifth bridge chip 220-5) for electrically connecting the plurality of second semiconductor chips 30b-1, 30b-2, 30b-3, 30b-4, and 30b-5 to at least one of the plurality of first semiconductor chips 30a-1 and 30a-2. Although not illustrated in the diagram, a bridge chip for connecting the plurality of first semiconductor chips 30a-1 and 30a-2 to each other may be further included.

For example, a first semiconductor chip 30a-1 may include a first interconnection pad 31a1-1 disposed in a region overlapping the first bridge chip 220-1, a first interconnection pad 31a1-5 disposed in a region overlapping the fifth bridge chip 220-5, and a first external connection pad 32a1 disposed in a region which does not overlap the first bridge chip 220-1 and the fifth bridge chip 220-5. The first semiconductor chip 30a-2 may include a first interconnection pad 31a2-2 disposed in a region overlapping the second bridge chip 220-2, a first interconnection pad 31a2-3 disposed in a region overlapping the third bridge chip 220-3, a first interconnection pad 31a2-4 disposed in a region overlapping the fourth bridge chip 220-4, and a first external connection pad 32a2 disposed in a region which does not overlap the second bridge chip 220-2, the third bridge chip 220-3, and the fourth bridge chip 220-4. The first interconnection pads 31a1-1, 31a2-2, 31a2-3, 31a2-4, and 31a1-5 may be electrically connected to the second interconnection pads 31b-1, 31b-2, 31b-3, 31b-4, and 31b-5 of the plurality of second semiconductor chips 30b-1, 30b-2, 30b-3, 30b-4, and 30b-5 through the corresponding bridge circuits (the first bridge circuit 222-1, the second bridge circuit 222-2, the third bridge circuit 222-3, the fourth bridge circuit 222-4, and the fifth bridge circuit 222-5), respectively.

The plurality of first semiconductor chips 30a-1 and 30a-2 may include an application processor such as a central processor (e.g., CPU), a graphics processor (e.g., GPU), a digital signal processor, an encryption processor, a microprocessor, and a microcontroller, and a logic chip such as an analog-digital converter, and an application-specific IC (ASIC), and the plurality of second semiconductor chips 30b-1, 30b-2, 30b-3, 30b-4, and 30b-5 may include a memory chip such as a volatile memory (e.g., DRAM), a non-volatile memory (e.g., ROM), and a flash memory.

As the elements illustrated in FIG. 7 which have the same reference numerals as in FIGS. 1 and 2 have technical features similar to those of the elements illustrated in FIGS. 1 and 2, the description thereof will not be repeated.

Figure 8:
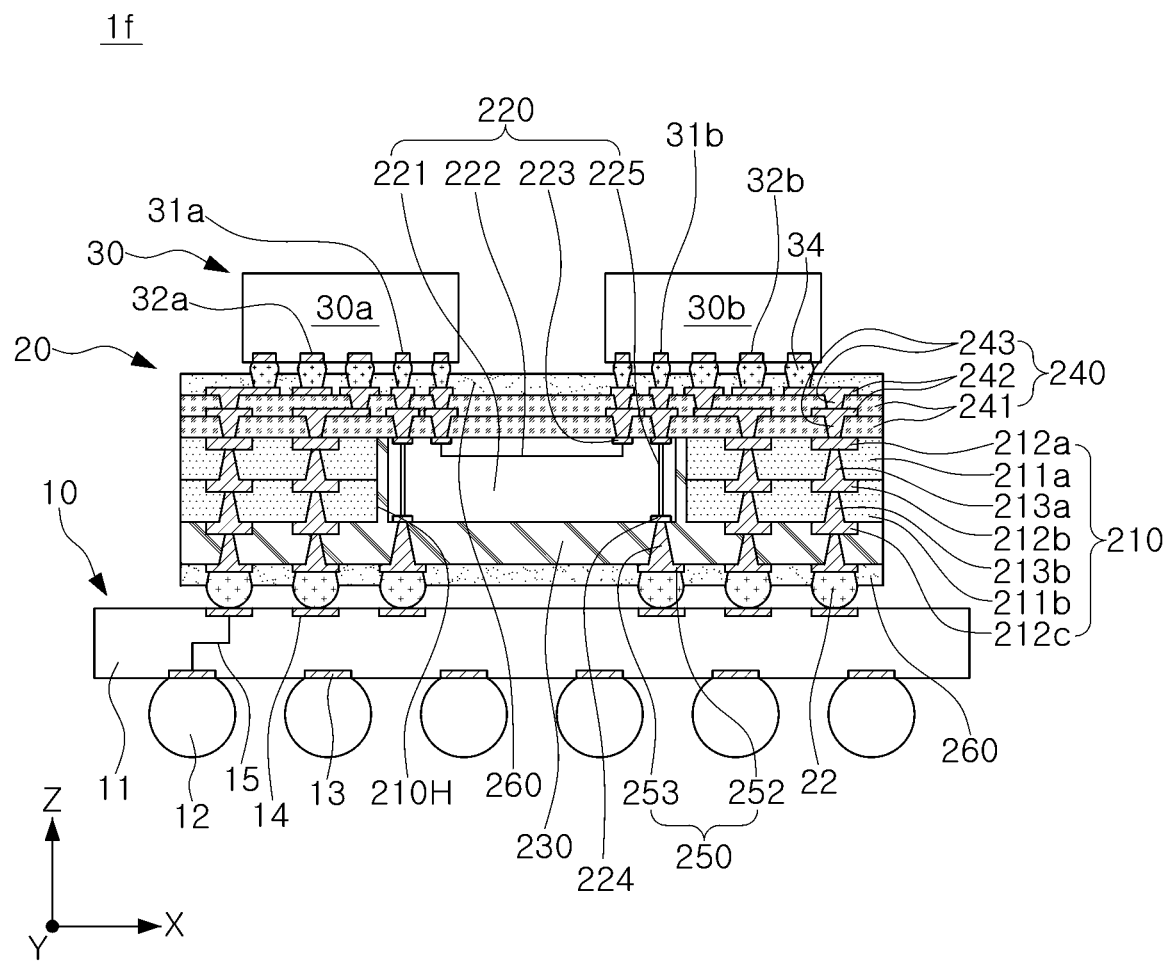
FIG. 8 is a cross-sectional diagram illustrating a semiconductor package according to an example embodiment of the present disclosure.

FIG. 8 is a cross-sectional diagram illustrating a semiconductor package if according to an example embodiment.

Referring to FIG. 8, in the semiconductor package 1f, a bridge chip 220 may include a plurality of front-surface bridge pads 223 disposed on a surface adjacent to a bridge circuit 222, a rear-surface bridge pad 224 disposed on a surface opposing the surface in which the plurality of front-surface bridge pads 223 are disposed, and a through via 225 for connecting at least a portion of the plurality of front-surface bridge pads 223 to the rear-surface bridge pad 224. The rear-surface bridge pad 224 may be electrically connected to the second redistribution structure 250. A portion of the first redistribution circuit and the second redistribution circuit of the first redistribution layers 242 connected to the bridge chip 220 may be connected to the second redistribution layer 252 through the through via 225.

As the elements illustrated in FIG. 8 which have the same reference numerals as in FIGS. 1 and 2 have technical features similar to those of the elements illustrated in FIGS. 1 and 2, the description thereof will not be repeated.

Figure 9:
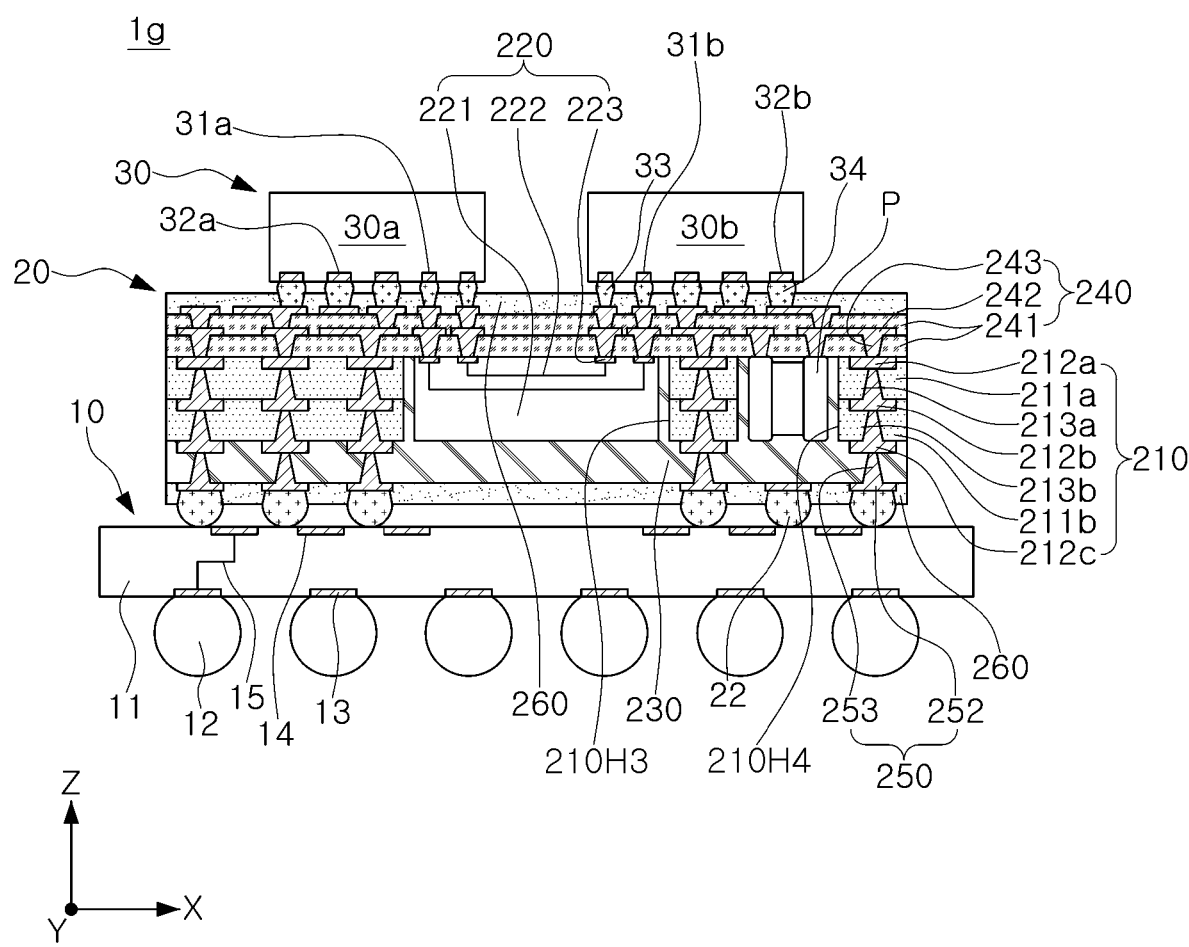
FIG. 9 is a cross-sectional diagram illustrating a semiconductor package according to an example embodiment of the present disclosure.

FIG. 9 is a cross-sectional diagram illustrating a semiconductor package according to an example embodiment.

Referring to FIG. 9, the semiconductor package 1g may further include a passive component (P) (e.g. a passive electrical component) disposed on a second surface of a first redistribution structure 240 and electrically connected to at least one of the first semiconductor chip 30a and the second semiconductor chip 30b through one or more first redistribution layers 242. A vertical connection structure 210 may have a second through-hole 210H4 for accommodating the passive component (P). The second through-hole 210H4 may be spaced apart from the first through-hole 210H3 for accommodating the bridge chip 220. The passive component (P) may be surrounded by a first frame insulating layer 211a and a second frame insulating layer 211b forming an internal wall of the second through-hole 210H4.

The passive component (P) may be configured as a capacitor such as a multilayer ceramic capacitor (MLCC) or a low inductance chip capacitor (LICC), an inductor such as a power inductor, a bead, or the like. The number of the passive component (P) is not limited to any particular number, and may be greater or less than the examples illustrated in the diagram.

As the elements illustrated in FIG. 9 which have the same reference numerals as in FIGS. 1 and 2 have technical features similar to those of the elements illustrated in FIGS. 1 and 2, the description thereof will not be repeated.

Figure 10:
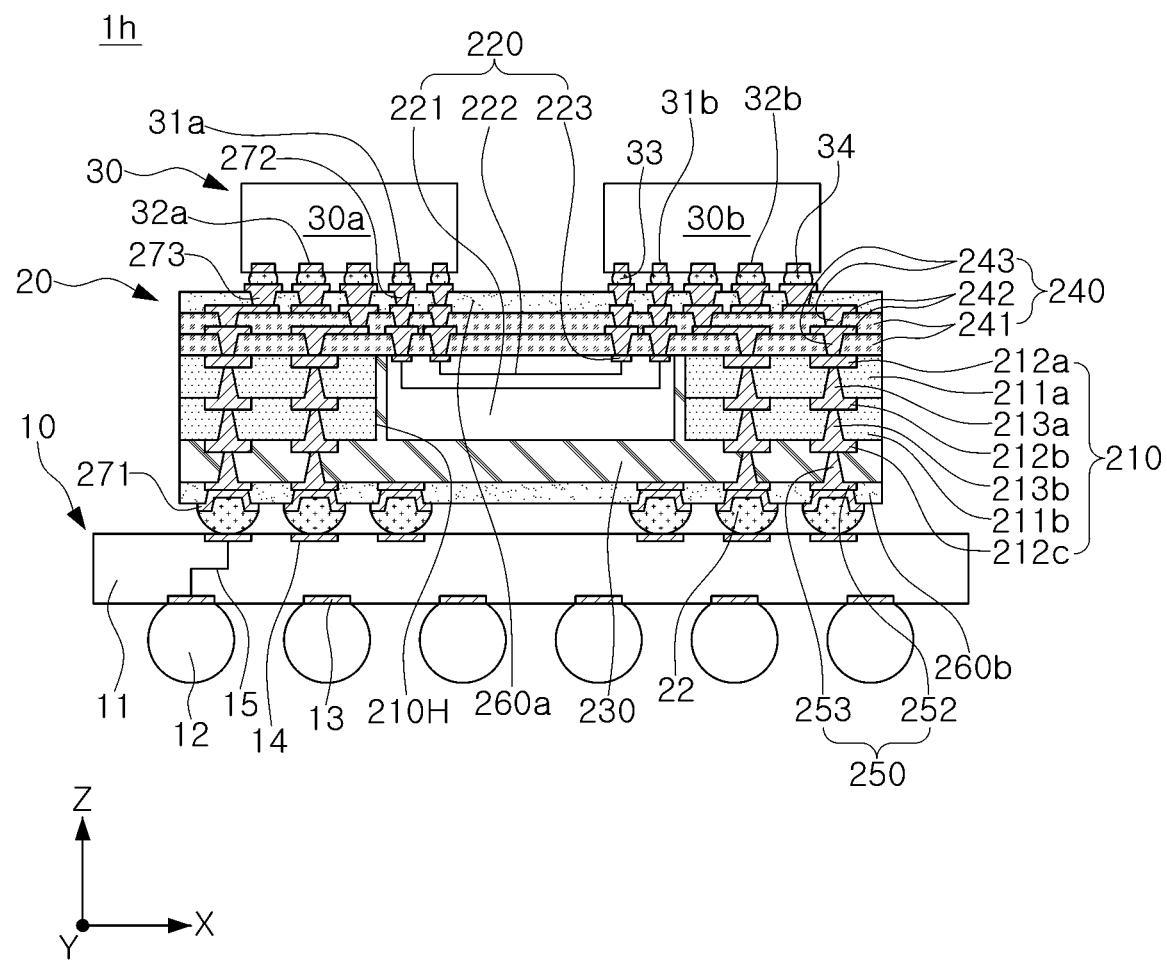
FIG. 10 is a cross-sectional diagram illustrating a semiconductor package according to an example embodiment of the present disclosure.

FIG. 10 is a cross-sectional diagram illustrating a semiconductor package 1h according to an example embodiment.

Referring to FIG. 10, the semiconductor package 1h may include a first protective layer 260a covering first redistribution layers 242, a second protective layer 260b covering a second redistribution layer 252, a first under bump metal 273 penetrating the first protective layer 260a and connecting a first redistribution circuit 242(1) (refer to FIG. 2) and a second redistribution circuit 242(2) (refer to FIG. 2) to one of the second internal connection bumps 33, a second under bump metal 271 penetrating the second protective layer 260b and connecting the second redistribution layer 252 to one of the first internal connection bumps 22, and a third under bump metal 273 penetrating the first protective layer 260a and connecting a third redistribution circuit 242(3) (refer to FIG. 2) to a third internal connection bump 34. A size of the first under bump metal 271 may be larger than a size of each of the second under bump metal 272 and the third under bump metal 273, and a size of the third under bump metal 273 may be larger than a size of the second under bump metal 272.

The under bump metals (the first under bump metal 271, the second under bump metal 272, and the third under bump metal 273) may improve connection reliability of the internal connection bumps (the first internal connection bumps 22, the second internal connection bumps 33, and the third internal connection bumps 34), and may improve board level reliability of the package. The under bump metals (the first under bump metal 271, the second under bump metal 272, and the third under bump metal 273) may be electrically connected to the first redistribution layers 242 and the second redistribution layer 252 exposed through openings of the first protective layer 260a and the second protective layer 260b. The under bump metals (the first under bump metal 271, the second under bump metal 272, and the third under bump metal 273) may be formed using a metal by a metallization method, but an example embodiment thereof is not limited thereto.

As the elements illustrated in FIG. 10 which have the same reference numerals as in FIGS. 1 and 2 have technical features similar to those of the elements illustrated in FIGS. 1 and 2, the description thereof will not be repeated.

Figure 11:
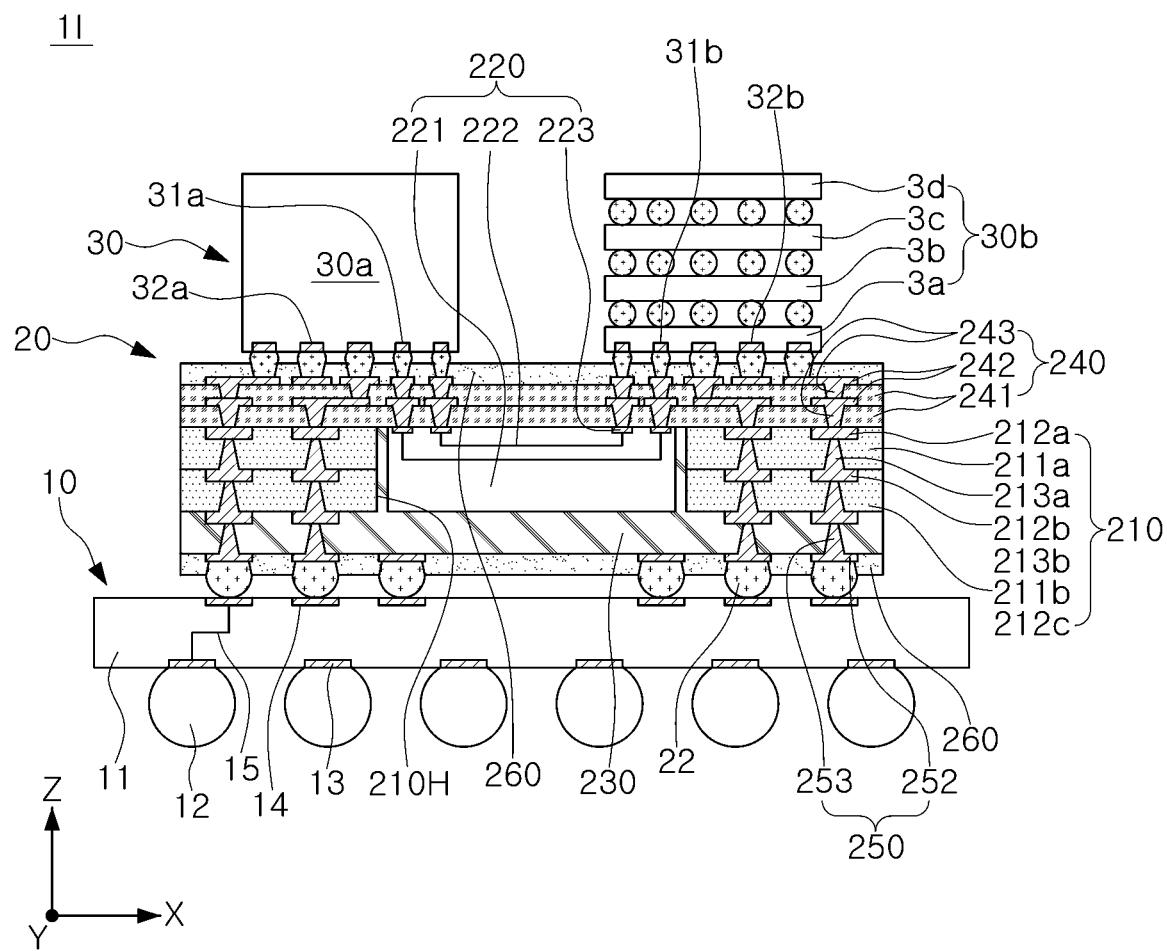
FIG. 11 is a cross-sectional diagram illustrating a semiconductor package according to an example embodiment of the present disclosure.

FIG. 11 is a cross-sectional diagram illustrating a semiconductor package 1I according to an example embodiment.

Referring to FIG. 11, in the semiconductor package 1I, a second semiconductor chip 30b may include a semiconductor chip stack, a high bandwidth memory (HBM), for example, in which a plurality of semiconductor chips 3a, 3b, 3c, and 3d are stacked in a direction (Z direction) perpendicular to an upper surface of the interposer package 20 or a first surface of a first redistribution structure 240.

As the elements illustrated in FIG. 11 which have the same reference numerals as in FIGS. 1 and 2 have technical features similar to those of the elements illustrated in FIGS. 1 and 2, the description thereof will not be repeated.

Figure 12:
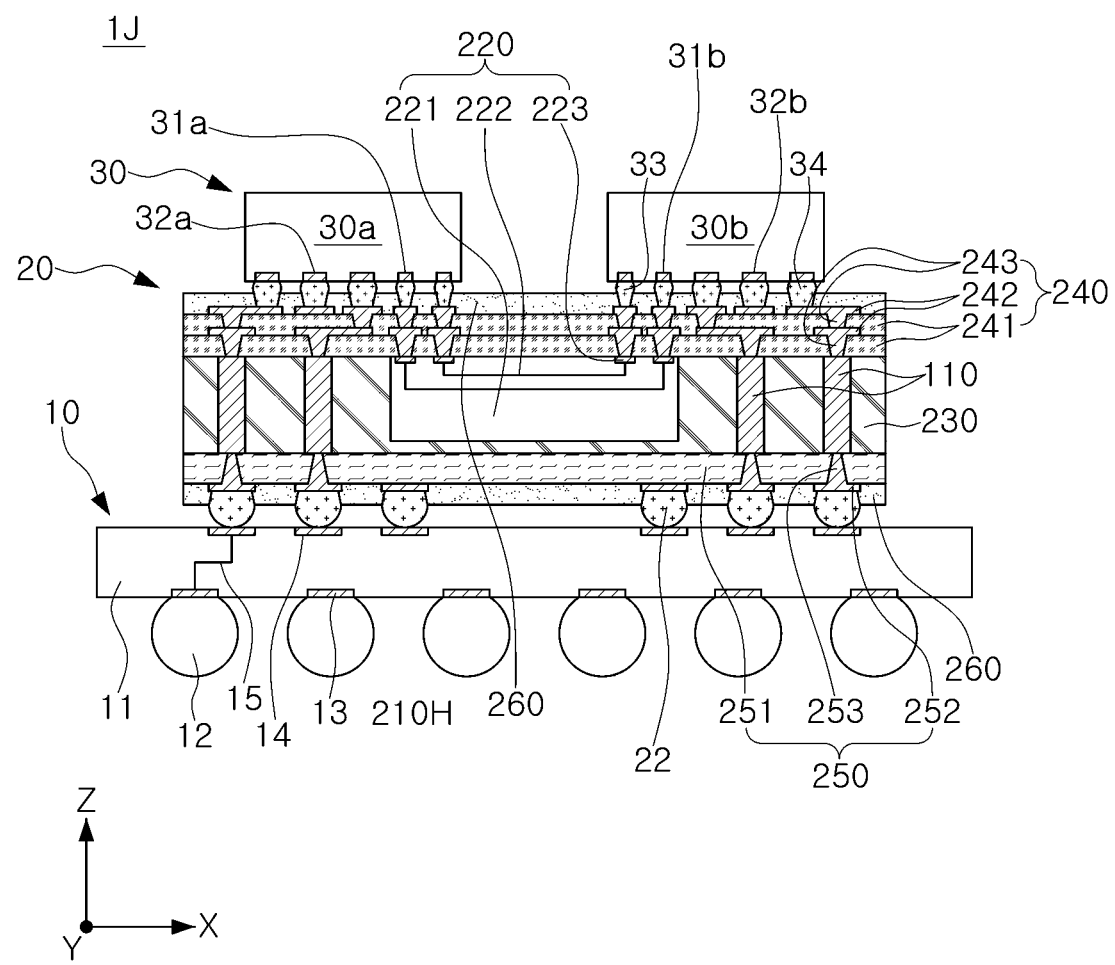
FIG. 12 is a cross-sectional diagram illustrating a semiconductor package according to an example embodiment of the present disclosure.

FIG. 12 is a cross-sectional diagram illustrating a semiconductor package according to an example embodiment.

Referring to FIG. 12, a semiconductor package 1J may include a conductive vertical connection structure 110 disposed around a bridge chip 220 and electrically connecting first redistribution layers 242 to a second redistribution layer 252. In the semiconductor package 1J, the conductive vertical connection structure 110 may have a form of a conductive post penetrating an encapsulant 230 rather than a form in which an insulating layer and a conductive layer are stacked. In this case, the second redistribution structure 250 may be formed on a planar surface formed by grinding one surface of the encapsulant 230 and exposing the conductive vertical connection structure 110. The second redistribution structure 250 may include an insulating layer 251 disposed on the planar surface of the encapsulant 230, a second redistribution layer 252 disposed on the insulating layer 251, and a second redistribution via 253 penetrating the insulating layer 251 and electrically connecting the second redistribution layer 252 to the conductive vertical connection structure 110.

As the elements illustrated in FIG. 12 which have the same reference numerals as in FIGS. 1 and 2 have technical features similar to those of the elements illustrated in FIGS. 1 and 2, the description thereof will not be repeated.

FIGS. 13 to 17 are cross-sectional diagrams illustrating a method of manufacturing a semiconductor package 1h illustrated in FIG. 10.

Figure 13:
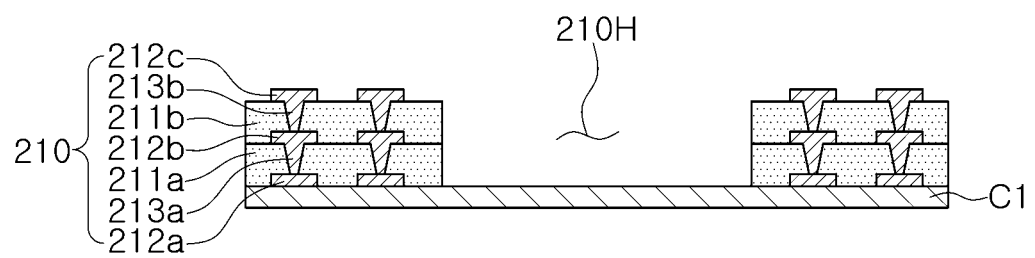
FIG. 13 is a first cross-sectional diagram illustrating a method of manufacturing a semiconductor package illustrated in FIG. 10.

Referring to FIG. 13, a vertical connection structure 210 having a through-hole 210H formed therein may be attached to a first carrier C1. The through-hole 210H may be formed by partially removing the first frame insulating layer 211a and the second frame insulating layer 211b of the vertical connection structure 210 by a physical or chemical method. For example, the through-hole 210H may be formed using a laser drill.

Figure 14:
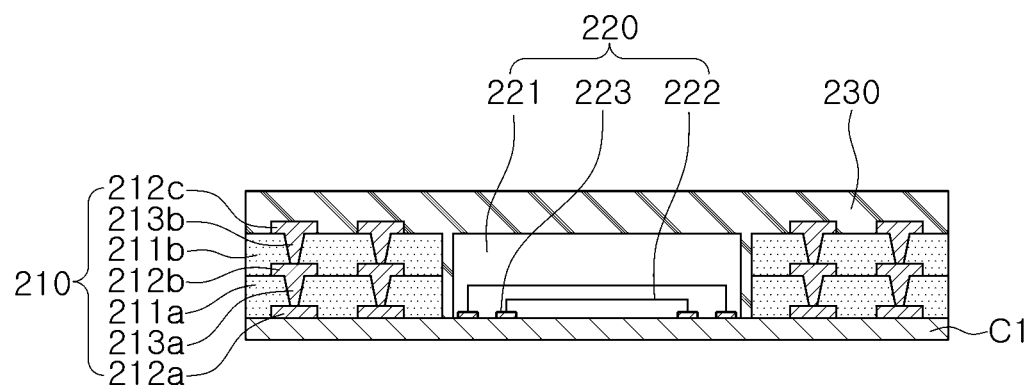
FIG. 14 is a second cross-sectional diagram illustrating the method of manufacturing the semiconductor package illustrated in FIG. 10.

Referring to FIG. 14, a bridge chip 220 may be disposed in the through-hole 210H of the vertical connection structure 210, and an encapsulant 230 for sealing the vertical connection structure 210 and the bridge chip 220 may be formed. The vertical connection structure 210 and the bridge chip 220 may have substantially the same height. The encapsulant 230 may fill the through-hole 210H and may cover upper surfaces of the bridge chip 220 and the vertical connection structure 210. The encapsulant 230 may be configured as an EMC including epoxy resin.

Figure 15:
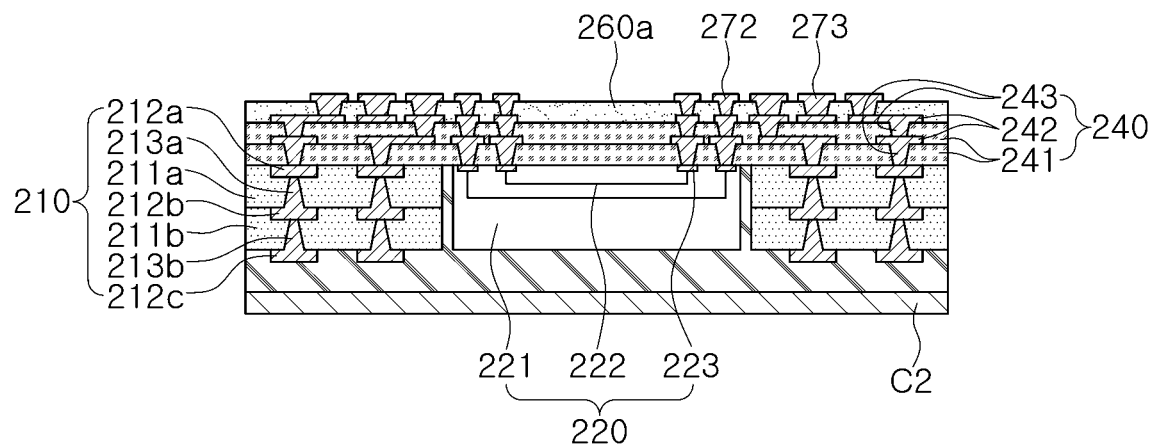
FIG. 15 is a third cross-sectional diagram illustrating the method of manufacturing the semiconductor package illustrated in FIG. 10.

Referring to FIG. 15, the first carrier C1 in FIG. 14 may be removed, the side on which the encapsulant 230 is formed may be attached to a second carrier C2, and the first redistribution structure 240 may be formed on the vertical connection structure 110 and the bridge chip 220. The first redistribution structure 240 may include one or more insulating layers 241 covering the vertical connection structure 110 and the bridge chip 220, one or more first redistribution vias 243 penetrating the one or more insulating layers 241, and one or more first redistribution layers 242 extending along a surface of the one or more insulating layers 241 on the one or more first redistribution vias 243. The one or more insulating layers 241 may include a photosensitive resin, and the one or more first redistribution vias 243 and the one or more first redistribution layers 242 may be formed through a photolithography process and a plating process.

Also, a first protective layer 260a covering the first redistribution layers 242 and the second under bump metal(s) 272 and the third under bump metal(s) 273 penetrating the first protective layer 260a may be formed. The first protective layer 260a may include a solder resist. A metal plating layer may be formed on surfaces of the second under bump metal(s) 272 and the third under bump metal(s) 273. The metal plating layer may have a multilayer structure in which a nickel (Ni) layer and a gold (Au) layer are stacked, for example.

Figure 16:
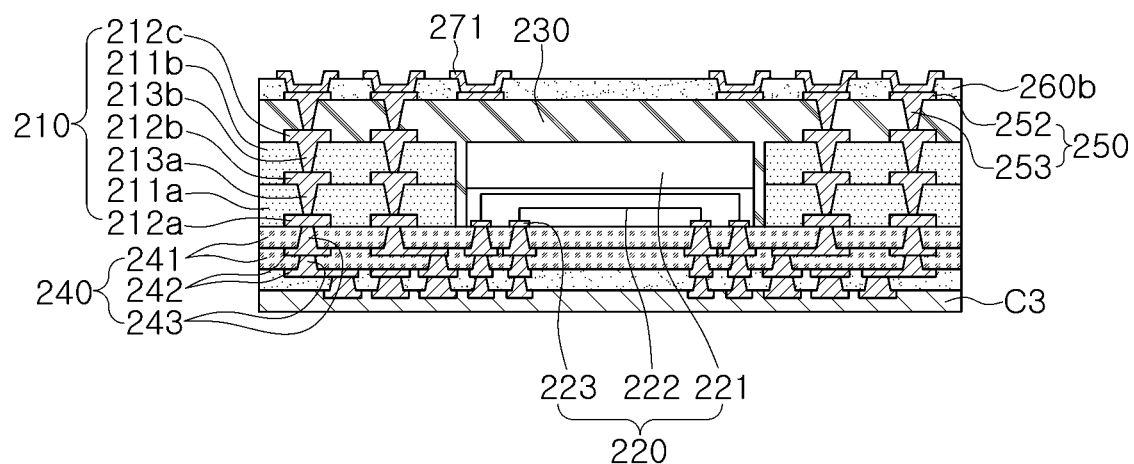
FIG. 16 is a fourth cross-sectional diagram illustrating the method of manufacturing the semiconductor package illustrated in FIG. 10.

Referring to FIG. 16, the second carrier C2 in FIG. 15 may be removed, the side on which the first redistribution structure 240 is formed may be attached to a third carrier C3, and the second redistribution structure 250 may be formed on the encapsulant 230. The second redistribution structure 250 may include a second redistribution via 253 penetrating the encapsulant 230 covering the upper surface of the vertical connection structure 210, and a second redistribution layer 252 extending along the surface of the encapsulant 230 on the second redistribution via 253. The second redistribution structure 250 may be formed using the same material and the same process as those of the first redistribution structure 240.

Also, a second protective layer 260b covering the second redistribution layer 252 and a first under bump metal 271 penetrating the second protective layer 260b may be formed. The above-described metal plating layer that may be formed on the second under bump metal 272 and the third under bump metal 273 may also be formed on the surface of the first under bump metal 271.

Figure 17:
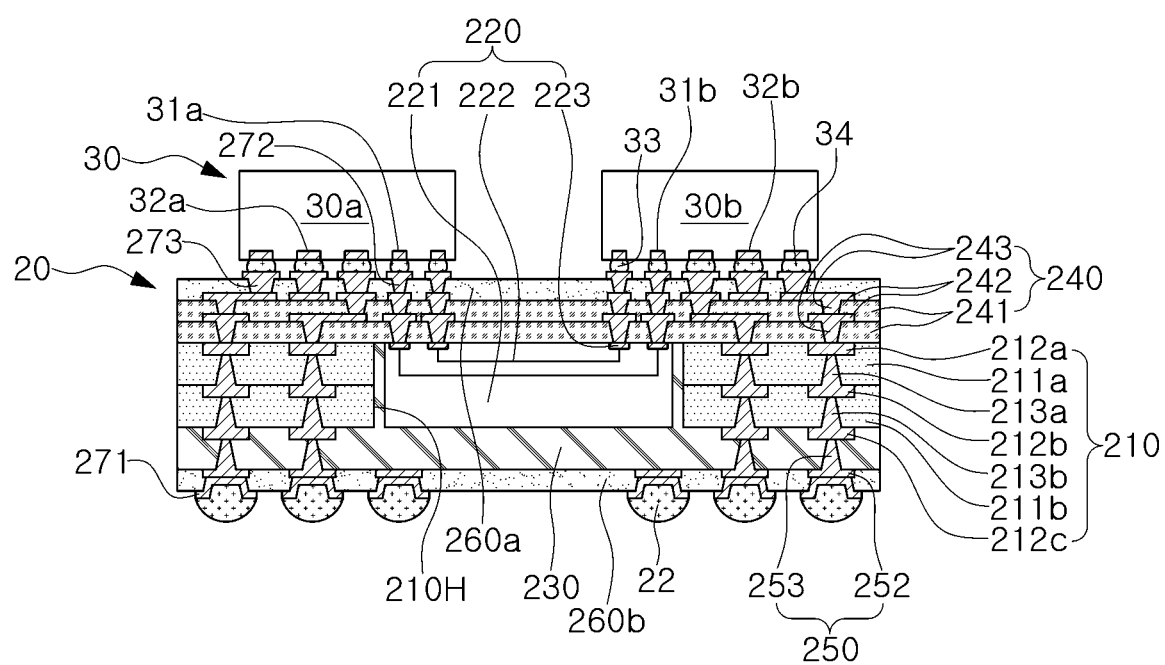
FIG. 17 is a fifth cross-sectional diagram illustrating the method of manufacturing the semiconductor package illustrated in FIG. 10.

Referring to FIG. 17, one of the first internal connection bumps 22 may be formed on the first under bump metal 271, the third carrier C3 in FIG. 16 may be removed, and the first semiconductor chip 30a and the second semiconductor chip 30b may be mounted on the first redistribution structure 240 using the second internal connection bumps 33 and the third internal connection bumps 34. The interposer package 20 on which the first semiconductor chip 30a and the second semiconductor chip 30b are mounted may be mounted on the base substrate through the first internal connection bumps 22.

According to the aforementioned example embodiments, by introducing the interposer package in which a microcircuit is formed and an interconnection chip is embedded, a semiconductor package having improved integration density and manufactured with reduced costs may be provided.

While example embodiments have been shown and described above, it will be apparent to those skilled in the art that modifications and variations could be made without departing from the scope of the present disclosure.

What is claimed is:
1. A semiconductor package, comprising:
a base substrate including a circuit layer;
an interposer package disposed on the base substrate; and
a first semiconductor chip and at least one second semiconductor chip disposed on the interposer package,
wherein the interposer package includes:
  a first redistribution structure including one or more insulating layers and a first redistribution layer disposed on each of the one or more insulating layers, and having a first surface on which the first semiconductor chip and the at least one second semiconductor chip are disposed and a second surface opposing the first surface;
  at least one bridge chip disposed on the second surface of the first redistribution structure and including a bridge circuit configured to electrically connect the first semiconductor chip to one of the at least one second semiconductor chip;
  a vertical connection structure disposed on the second surface of the first redistribution structure, and including a plurality of wiring layers electrically connected to the first semiconductor chip and the one of the at least one second semiconductor chip and disposed on different levels;
  an encapsulant disposed on the second surface of the first redistribution structure and encapsulating the at least one bridge chip and the vertical connection structure; and
  a second redistribution structure disposed on the encapsulant and having a second redistribution layer electrically connected to the plurality of wiring layers of the vertical connection structure,
wherein each of the first semiconductor chip and the one of the at least one second semiconductor chip is electrically connected to the bridge circuit of one or more of the at least one bridge chip and the plurality of wiring layers of the vertical connection structure through the first redistribution layer,
wherein the at least one bridge chip further includes:
  first surface bridge pads that are on a first surface of the at least one bridge chip;
  second surface bridge pads that are on a second surface of the at least one bridge chip, opposite to the first surface of the at least one bridge chip; and
  a through via that connects a first bridge pad from among the first surface bridge pads to one from among the second surface bridge pads,
wherein a second bridge pad and a third bridge pad from among the first surface bridge pads are connected together via the bridge circuit of the at least one bridge chip, without being connected to any of the second surface bridge pads,
wherein the second bridge pad and the third bridge pad are closest bridge pads, among the first surface bridge pads, to a center of the at least one bridge chip in a horizontal direction, and the first bridge pad is a closest bridge pad, among the first surface bridge pads, to a side of the at least one bridge chip in the horizontal direction,
wherein the second bridge pad and the third bridge pad are spaced apart from each other in a first direction, wherein the bridge circuit has bridge patterns, each of the bridge patterns electrically connecting the second bridge pad and the third bridge pad to each other, wherein a maximum line width of the bridge circuit is less than a maximum line width of the first redistribution layer and a maximum line width of the second redistribution layer, wherein the first redistribution structure further includes first redistribution vias spaced apart from each other in the first direction, wherein the first redistribution layer extends in the first direction to electrically connect the first redistribution vias to each other, wherein the second redistribution structure further includes second redistribution vias spaced apart from each other in the first direction, and wherein the second redistribution layer extends in the first direction to electrically connect the second redistribution vias to each other.

2. The semiconductor package of claim 1, wherein the vertical connection structure includes:
- a first frame insulating layer in contact with the second surface of the first redistribution structure;
- a first wiring layer, from among the plurality of wiring layers, in contact with the second surface of the first redistribution structure and buried in the first frame insulating layer;
- a second wiring layer, from among the plurality of wiring layers, disposed on a surface of the first frame insulating layer opposing a surface of the first frame insulating layer in which the first wiring layer is buried;
- a second frame insulating layer disposed on the first frame insulating layer and covering the second wiring layer;
- a third wiring layer, from among the plurality of wiring layers, disposed on the second frame insulating layer;
- a first wiring via penetrating the first frame insulating layer and electrically connecting the first wiring layer to the second wiring layer; and
- a second wiring via penetrating the second frame insulating layer and electrically connecting the second wiring layer to the third wiring layer.

3. The semiconductor package of claim 1, wherein the first redistribution vias penetrate the one or more insulating layers and electrically connect the first redistribution layer to the bridge circuit of one of the at least one bridge chip, and the plurality of wiring layers.

4. The semiconductor package of claim 1, wherein the first redistribution layer includes:
- a first redistribution circuit connecting the first semiconductor chip to the bridge circuit of one of the at least one bridge chip;
- a second redistribution circuit connecting the one of the at least one second semiconductor chip to the bridge circuit of the one of the at least one bridge chip; and
- a third redistribution circuit connecting the first semiconductor chip and the one of the at least one second semiconductor chip to the plurality of wiring layers.

5. The semiconductor package of claim 4, further comprising:
- a first internal connection bump connecting the second redistribution layer of the second redistribution structure to the circuit layer of the base substrate, second internal connection bumps connecting the first semiconductor chip and the one of the at least one second semiconductor chip to the first redistribution circuit and the second redistribution circuit, respectively, and third internal connection bumps connecting the first semiconductor chip and the one of the at least one second semiconductor chip to the third redistribution circuit.

6. The semiconductor package of claim 5,
wherein a size of the first internal connection bump is greater than a size of each of the second internal connection bumps and the third internal connection bumps, and
wherein the size of the third internal connection bumps is greater than the size of the second internal connection bumps.

7. The semiconductor package of claim 1, wherein the bridge circuit, of one of the at least one bridge chip, has bridge patterns in a form of a line and space, a line width of each of the bridge patterns is 2 µm or less, and a distance between adjacent bridge patterns from among the bridge patterns is 2 µm or less.

8. The semiconductor package of claim 1, wherein the second redistribution vias are configured to electrically connect the second redistribution layer to a wiring layer from among the plurality of wiring layers adjacent to the second redistribution layer.

9. The semiconductor package of claim 1,
wherein the first semiconductor chip includes a logic chip, and
wherein the at least one second semiconductor chip includes a memory chip.

10. The semiconductor package of claim 1, wherein the one of the at least one second semiconductor chip includes a plurality of semiconductor chips stacked in a direction perpendicular to the first surface of the first redistribution structure.

11. A semiconductor package, comprising:
a base substrate;
an interposer package disposed on the base substrate and including at least one bridge chip having a bridge circuit; and
at least one first semiconductor chip and at least one second semiconductor chip disposed on the interposer package and each overlapping at least a portion of the at least one bridge chip in a direction perpendicular to an upper surface of the interposer package,
wherein the at least one first semiconductor chip includes a plurality of first interconnection pads disposed in a first region overlapping the at least one bridge chip and a plurality of first external connection pads disposed in a second region which does not overlap the at least one bridge chip,
wherein the at least one second semiconductor chip includes a plurality of second interconnection pads disposed in a third region overlapping the at least one bridge chip and a plurality of second external connection pads disposed in a fourth region which does not overlap the at least one bridge chip,
wherein the plurality of first interconnection pads are connected to the plurality of second interconnection pads through the bridge circuit of the at least one bridge chip,
wherein a size of each of the plurality of first interconnection pads and the plurality of second interconnection pads is smaller than a size of each of the plurality of first external connection pads and the plurality of second external connection pads,
wherein the interposer package further comprises:
a first redistribution structure including one or more insulating layers and a first redistribution layer disposed on each of the one or more insulating layers, and having a first surface on which the at least one first semiconductor chip and the at least one second semiconductor chip are disposed and a second surface opposing the first surface;
a vertical connection structure disposed on the second surface of the first redistribution structure, and including a plurality of wiring layers electrically connected to one of the at least one first semiconductor chip and one of the at least one second semiconductor chip and disposed on different levels;
an encapsulant disposed on the second surface of the first redistribution structure and encapsulating the at least one bridge chip and the vertical connection structure; and
a second redistribution structure disposed on the encapsulant and having a second redistribution layer electrically connected to the plurality of wiring layers of the vertical connection structure,
wherein the at least one bridge chip further includes:
first surface bridge pads that are at a first surface of the at least one bridge chip;
second surface bridge pads that are at a second surface of the at least one bridge chip, opposite to the first surface of the at least one bridge chip; and
a through via that connects a first bridge pad from among the first surface bridge pads to one from among the second surface bridge pads,
wherein a second bridge pad and a third bridge pad from among the first surface bridge pads are connected together via the bridge circuit of the at least one bridge chip, without being connected to any of the second surface bridge pads,
wherein the second bridge pad and the third bridge pad are closest bridge pads, among the first surface bridge pads, to a center of the at least one bridge chip in a horizontal direction, and the first bridge pad is a closest bridge pad, among the first surface bridge pads, to a side of the at least one bridge chip in the horizontal direction,
wherein the second bridge pad and the third bridge pad are spaced apart from each other in a first direction,
wherein the bridge circuit has bridge patterns, each of the bridge patterns electrically connecting the second bridge pad and the third bridge pad to each other,
wherein a maximum line width of the bridge circuit is less than a maximum line width of the first redistribution layer and a maximum line width of the second redistribution layer,
wherein the first redistribution structure further includes first redistribution vias spaced apart from each other in the first direction,
wherein the first redistribution layer extends in the first direction to electrically connect the first redistribution vias to each other,
wherein the second redistribution structure further includes second redistribution vias spaced apart from each other in the first direction, and
wherein the second redistribution layer extends in the first direction to electrically connect the second redistribution vias to each other.

12. The semiconductor package of claim 11,
wherein the at least one bridge chip is a plurality of bridge chips overlapping the at least one first semiconductor chip and the at least one second semiconductor chip and spaced apart from each other, and
wherein the interposer package has a plurality of through-holes accommodating the plurality of bridge chips, respectively.

13. A semiconductor package, comprising:
a base substrate including a circuit layer;
an interposer package disposed on the base substrate;
a first semiconductor chip and a second semiconductor chip disposed on the interposer package;
first internal connection bumps disposed between the base substrate and the interposer package;
second internal connection bumps and third internal connection bumps disposed between the interposer package and the first semiconductor chip, and disposed between the interposer package and the second semiconductor chip; and
an external connection bump disposed on a side of the base substrate that is opposite from a surface of the base substrate that faces the first internal connection bumps, and the external connection bump electrically connected to the circuit layer,
wherein each of the first semiconductor chip and the second semiconductor chip respectively includes:
a plurality of first interconnection pads and a plurality of second interconnection pads connected to respective ones of the second internal connection bumps; and
a plurality of first external connection pads and a plurality of second external connection pads connected to respective ones of the third internal connection bumps, and
wherein the interposer package includes:
a first redistribution structure including a first syrface on which the first semiconductor chip and the second semiconductor chip are disposed and a second surface opposing the first surface, the first redistribution structure further including a first redistribution layer that includes a first redistribution circuit connected to the plurality of first interconnection pads through the second internal connection bumps, a second redistribution circuit connected to the plurality of second interconnection pads through the second internal connection bumps, and a third redistribution circuit connected to the plurality of first external connection pads and the plurality of second external connection pads through the third internal connection bumps;
a bridge chip disposed on the second surface of the first redistribution structure and electrically connecting the first redistribution circuit to the second redistribution circuit, and including a bridge circuit;
a vertical connection structure disposed on the second surface of the first redistribution structure, the vertical connection structure including a first through-hole accommodating the bridge chip and further including a plurality of wiring layers electrically connected to the third redistribution circuit;
an encapsulant encapsulating the vertical connection structure and the bridge chip; and
a second redistribution structure disposed on the encapsulant and having a second redistribution layer electrically connected to the plurality of wiring layers of the vertical connection structure, where the second redistribution layer is connected to the circuit layer of the base substrate through the first internal connection bumps,
wherein a pitch of each of the plurality of first interconnection pads and the plurality of second interconnection pads is smaller than a pitch of each of the plurality of first external connection pads and the plurality of second external connection pads, wherein the bridge chip further includes:
    first surface bridge pads that are on a first surface of the bridge chip;
    second surface bridge pads that are on a second surface of the bridge chip, opposite to the first surface of the bridge chip; and
    a through via that connects a first bridge pad from among the first surface bridge pads to one from among the second surface bridge pads,
wherein a second bridge pad and a third bridge pad from among the first surface bridge pads are connected together via the bridge circuit of the bridge chip, without being connected to any of the second surface bridge pads,
wherein the second bridge pad and the third bridge pad are closest bridge pads, among the first surface bridge pads, to a center of the bridge chip in a horizontal direction, and the first bridge pad is a closest bridge pad, among the first surface bridge pads, to a side of the bridge chip in the horizontal direction,
wherein the second bridge pad and the third bridge pad are spaced apart from each other in a first direction,
wherein the bridge circuit has bridge patterns, each of the bridge patterns electrically connecting the second bridge pad and the third bridge pad to each other,
wherein a maximum line width of the bridge circuit is less than a maximum line width of the first redistribution layer and a maximum line width of the second redistribution layer,
wherein the first redistribution structure further includes first redistribution vias spaced apart from each other in the first direction,
wherein the first redistribution layer extends in the first direction to electrically connect the first redistribution vias to each other,
wherein the second redistribution structure further includes second redistribution vias spaced apart from each other in the first direction, and
wherein the second redistribution layer extends in the first direction to electrically connect the second redistribution vias to each other.

14. The semiconductor package of claim 13, further comprising:
    a passive electrical component disposed on the second surface of the first redistribution structure and electrically connected to at least one of the first semiconductor chip and the second semiconductor chip through the first redistribution layer,
    wherein the vertical connection structure further includes a second through-hole that accommodates the passive electrical component.

15. The semiconductor package of claim 13, further comprising:
    a first protective layer covering the first redistribution layer;
    a second protective layer covering the second redistribution layer, a first under bump metal penetrating the second protective layer and connecting the second redistribution layer to one of the first internal connection bumps,
    second under bump metals penetrating the first protective layer and connecting the first redistribution circuit and the second redistribution circuit to respective ones of the second internal connection bumps; and
    third under bump metals penetrating the first protective layer and connecting the third redistribution circuit to respective ones of the third internal connection bumps,
    wherein a size of the first under bump metal is greater than a size of each of the second under bump metals and the third under bump metals, and
    wherein the size of the third under bump metals is greater than the size of the second under bump metals.

* * * * *